(12) United States Patent
Kondo et al.

(10) Patent No.: US 8,830,742 B2
(45) Date of Patent: Sep. 9, 2014

(54) MAGNETIC MEMORY

(71) Applicants: Tsuyoshi Kondo, Kawasaki (JP);
Hirofumi Morise, Yokohama (JP);
Shiho Nakamura, Fujisawa (JP)

(72) Inventors: Tsuyoshi Kondo, Kawasaki (JP);
Hirofumi Morise, Yokohama (JP);
Shiho Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/713,482

(22) Filed: Dec. 13, 2012

(65) Prior Publication Data

US 2013/0235653 A1    Sep. 12, 2013

(30) Foreign Application Priority Data

Mar. 6, 2012   (JP) ................................. 2012-049642

(51) Int. Cl.
| | |
|---|---|
| *G11C 11/15* | (2006.01) |
| *G11C 11/10* | (2006.01) |
| *G11C 11/02* | (2006.01) |
| *G11C 11/16* | (2006.01) |
| *G11C 11/06* | (2006.01) |
| *G11C 11/155* | (2006.01) |

(52) U.S. Cl.
CPC .............. *G11C 11/16* (2013.01); *G11C 11/161* (2013.01)
USPC ................ 365/173; 365/51; 365/66; 365/158; 365/171

(58) Field of Classification Search
CPC ..... G11C 11/16; G11C 11/15; G11C 11/5607
USPC ................................ 365/51, 66, 158, 171, 173
See application file for complete search history.

(56) References Cited

U.S. PATENT DOCUMENTS

| | | | | |
|---|---|---|---|---|
| 3,576,552 | A  * | 4/1971 | Vinal | 365/173 |
| 6,834,005 | B1 | 12/2004 | Parkin | |
| 7,099,185 | B2 * | 8/2006 | Yamamoto et al. | 365/158 |
| 7,307,876 | B2 * | 12/2007 | Kent et al. | 365/171 |
| 7,483,291 | B2 * | 1/2009 | Saito et al. | 365/158 |
| 7,936,595 | B2 * | 5/2011 | Han et al. | 365/171 |
| 8,553,449 | B2 * | 10/2013 | Liu et al. | 365/158 |
| 2014/0048895 | A1 * | 2/2014 | Huang et al. | 257/421 |

FOREIGN PATENT DOCUMENTS

JP   2002-522917 A   7/2002

OTHER PUBLICATIONS

Office Action mailed Apr. 22, 2014, in Japanese Patent Application No. 2012-049642, (w/English translation),1-4.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A magnetic memory according to an embodiment includes: a magnetic structure extending in a first direction and having a circular ring-like shape in cross-section in a plane perpendicular to the first direction; a nonmagnetic layer formed on an outer surface of the magnetic structure, the outer surface extending in the first direction; and at least one reference portion formed on part of a surface of the nonmagnetic layer, the surface being on the opposite side from the magnetic structure, the at least one reference portion containing a magnetic material.

16 Claims, 32 Drawing Sheets

MAGNETIC MEMORY

CROSS-REFERENCE TO RELATED APPLICATION

This application is based upon and claims the benefit of priority from prior Japanese Patent Application No. 2012-49642 filed on Mar. 6, 2012 in Japan, the entire contents of which are incorporated herein by reference.

FIELD

Embodiments described herein relate generally to magnetic memories.

BACKGROUND

Magnetic domain wall memory is one type of memory. In a magnetic domain wall memory, a magnetic material is used as a portion to record information. Information is expressed by a magnetic domain structure formed by the magnetization of the magnetic material, the locations of the magnetic domains, or the spatial distribution of magnetization in the domain walls. Magnetic memory so-called "racetrack memory" is also one type of magnetic domain wall memory.

Arranging magnetic domains in a line in the magnetic material gives rise to high density information storage of a magnetic domain wall memory. Therefore, the magnetic material that stores information has a linear shape or a curved shape. When a current is applied in the direction in which the magnetic domains are arranged, the domain walls shift toward the direction in which the current flows. In the magnetic domain wall memory, this phenomenon is utilized to shift the domain walls, after the magnetization of an extended portion of the magnetic material is reversed, or after the magnetization state of part of the magnetic material is converted into an electrical signal. An information write/read operation is performed in this manner.

A large number of magnetic materials to record information are installed as nanowires at a high density in a direction being perpendicular to the wafer surface. With this arrangement, a large-capacity magnetic domain wall memory can be realized. Micromachining is performed on the wafer, to form a three-dimensional structure such as a hole-like or pillar-like structure, which becomes a template for the magnetic nanowire. A magnetic thin film is then formed on the surface of the three-dimensional structure, and is divided into minute parts, to form the nanowires. Alternatively, holes that are formed through an electrochemical reaction are filled with a magnetic material, to form the nanowires. In either case, the micromachining for fabrication of the nanowires or the electrodes, to be used for the electrochemical reaction, is necessary and then it results in higher manufacturing costs.

DETAILED DESCRIPTION

A magnetic memory according to an embodiment includes: a magnetic structure extending in a first direction and having a circular ring-like shape in cross-section in a plane perpendicular to the first direction; a nonmagnetic layer formed on an outer surface of the magnetic structure, the outer surface extending in the first direction; and at least one reference portion formed on part of a surface of the nonmagnetic layer, which consists of a magnetic material on the surface of the nonmagnetic layer being on the opposite side from the magnetic structure.

The following is a description of embodiments, with reference to the accompanying drawings.

First Embodiment

Figure 1:
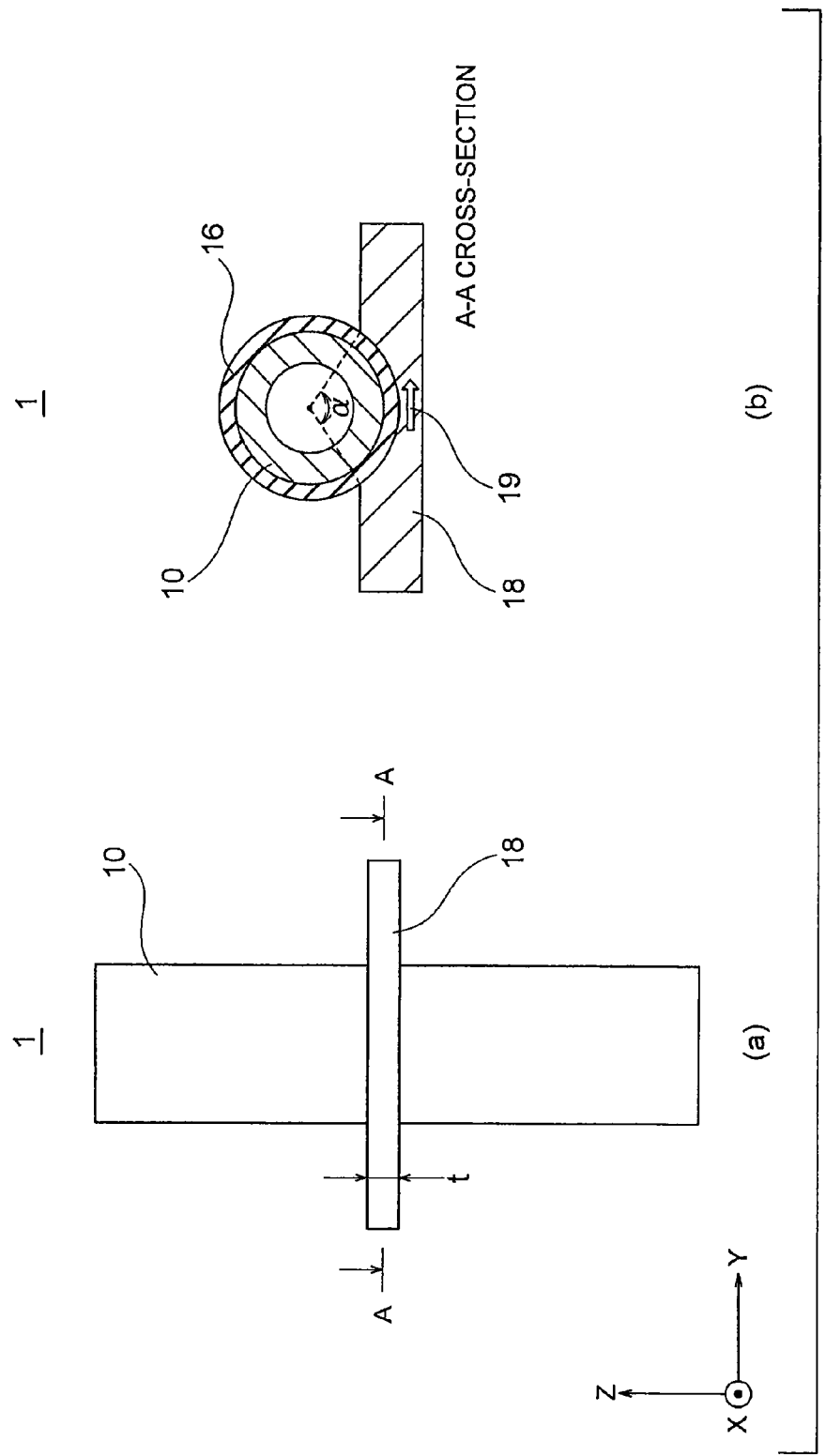
FIGS. 1(a) and 1(b) are diagrams showing a magnetic memory according to a first embodiment.
Figure 2:
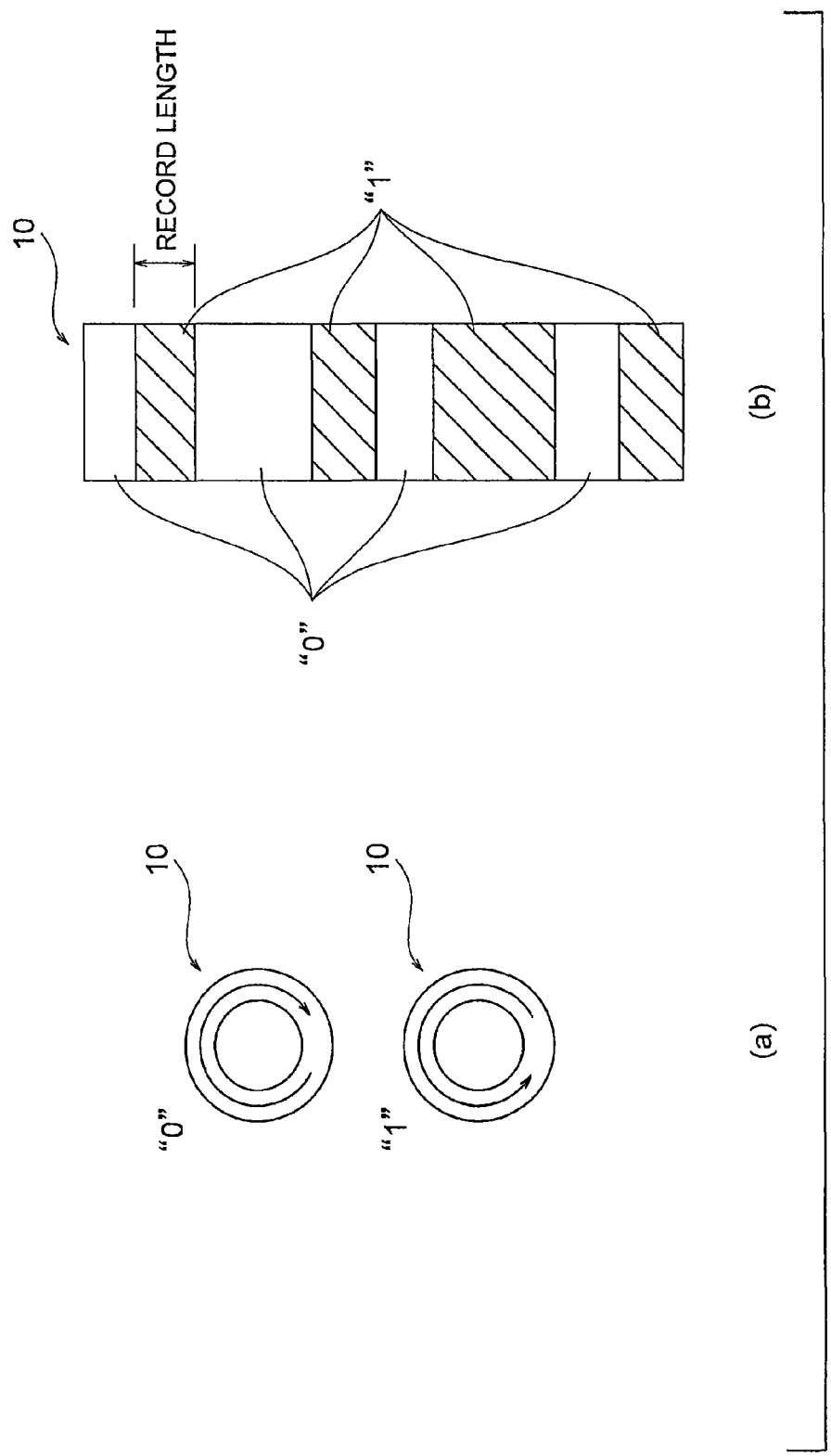
FIGS. 2(a) and 2(b) are diagrams for explaining an example of information stored in the magnetic memory.
Figure 3:
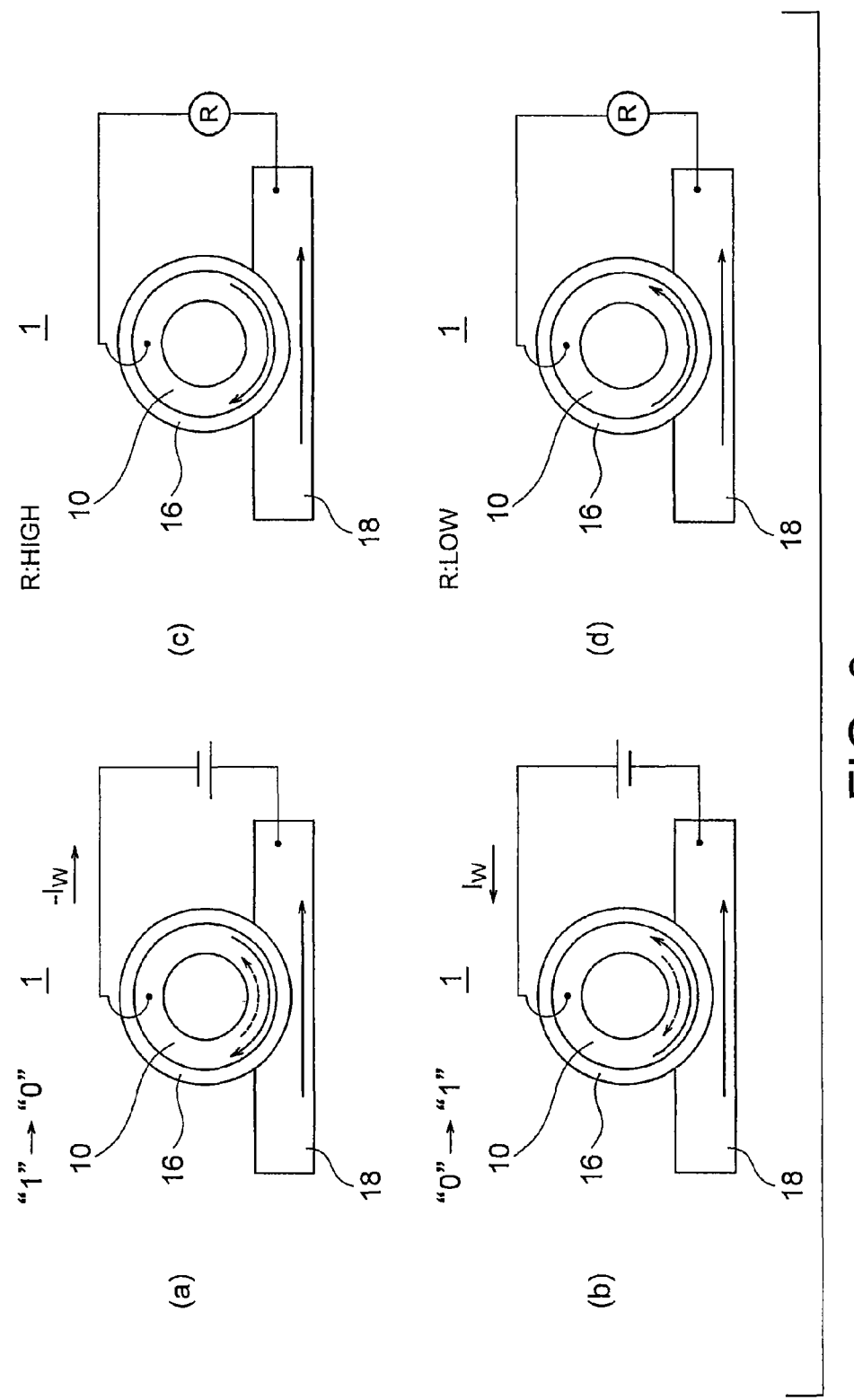
FIGS. 3(a) through 3(d) are diagrams for explaining the state of information written into the magnetic tube and the state of information read from the magnetic tube.
Figure 4:
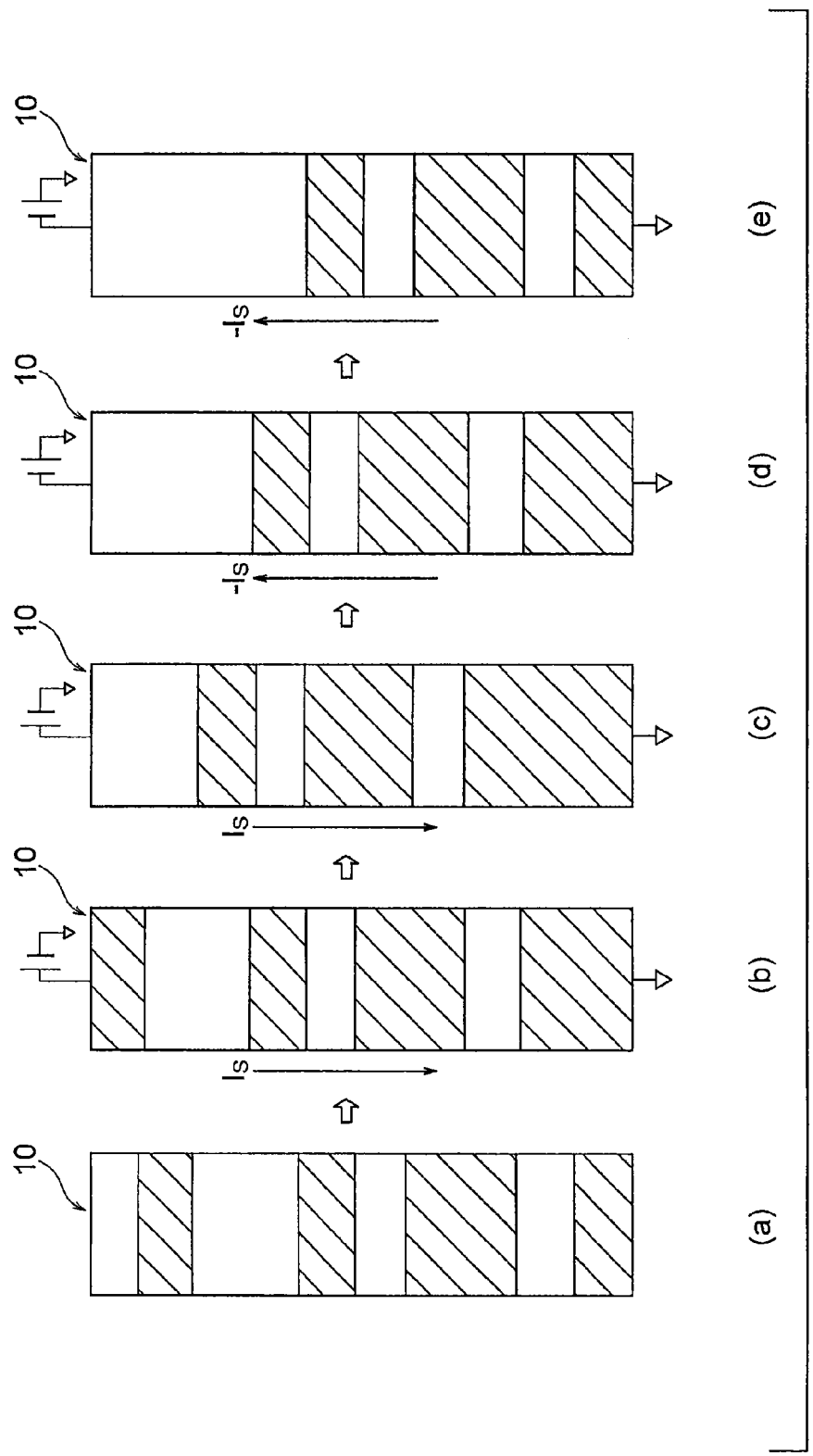
FIGS. 4(a) through 4(e) are diagrams for explaining a shift operation.
Figure 5:
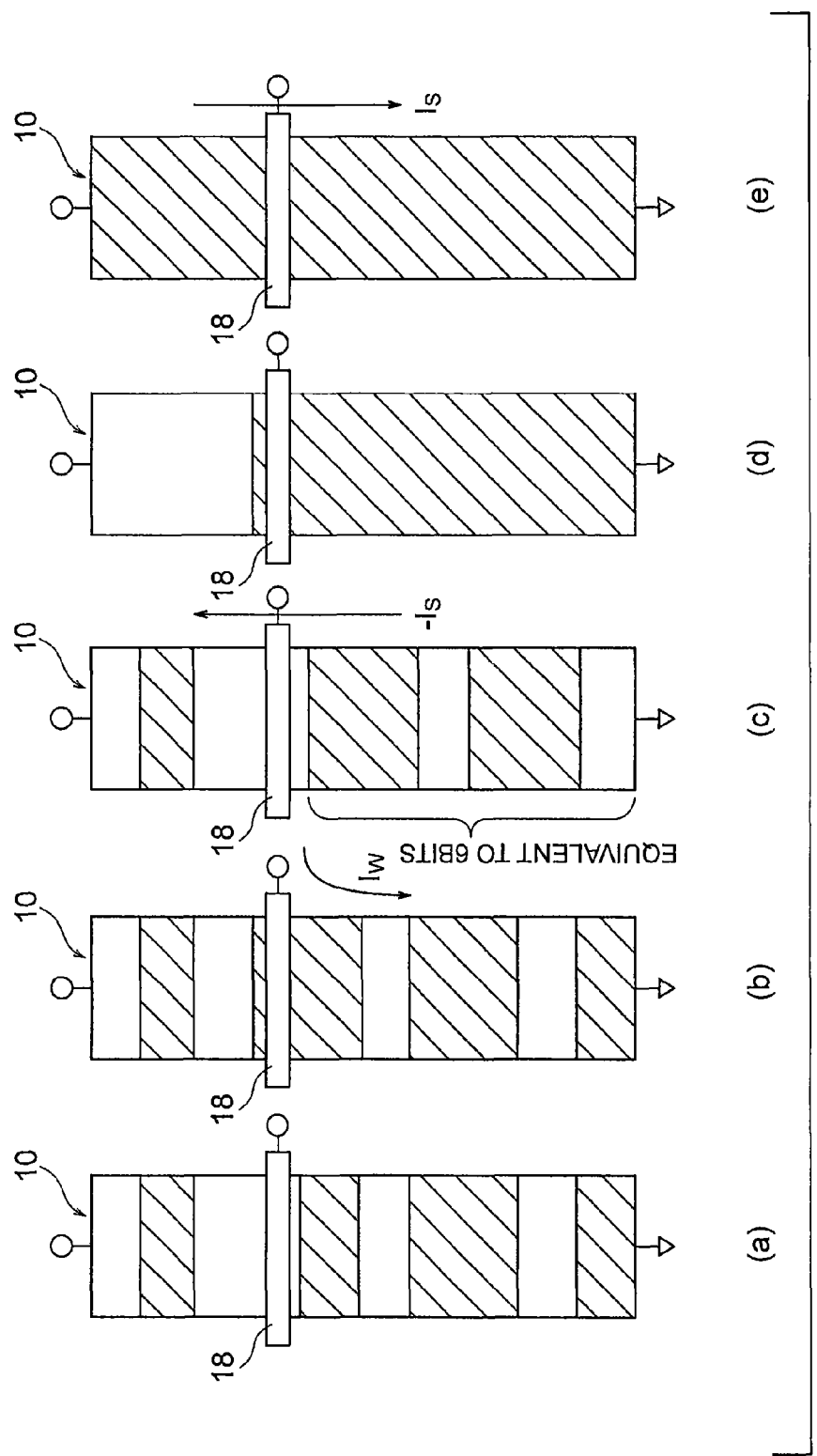
FIGS. 5(a) through 5(e) are diagrams for explaining a write operation.

FIGS. 1(a) and 1(b) show a magnetic memory element (also referred to as magnetic memory cells) according to a first embodiment. FIG. 1(a) is a front view of the magnetic memory element 1 of the first embodiment. FIG. 1(b) is a cross-sectional view of the magnetic memory element 1, taken along the section line A-A defined in FIG. 1(a). The magnetic memory element 1 of the first embodiment includes a magnetic tube 10, an intermediate layer 16, and a reference portion 18. The magnetic tube 10 extends in a first direction (the z-axis direction), and has a circular ring-like cross-section shape (a cross-section in the x-y plane being perpendicular to the first direction). The intermediate layer 16 is formed on the outer surface of the magnetic tube 10. The reference portion 18 is formed in a partial region of the outer surface of the magnetic tube 10 via the intermediate layer 16. In FIGS. 1(a) and 1(b), the intermediate layer 16 is formed on the entire outer surface of the magnetic tube 10 except for the end surfaces of the magnetic tube 10, but can also be provided in the region where the reference portion 18 is formed. The inside of the magnetic tube 10 can be hollow. Alternatively, the inside of the magnetic tube 10 can be filled with a material such as an insulator, a semiconductor, a ferroelectric material, or a metal. An angle α in the x-y plane, at the center of the magnetic tube 10, subtended by the contact surface between the reference portion 18 and the intermediate layer 16 on the magnetic tube 10 does not exceed 180 degrees.

The reference portion 18 is formed with a ferromagnetic material. The ferromagnetic material that can be used here is an alloy of at least one element selected from iron (Fe), cobalt (Co), nickel (Ni), manganese (Mn), and chromium (Cr), and at least one element selected from platinum (Pt), palladium (Pd), iridium (Ir), ruthenium (Ru), and rhodium (Rh). The ferromagnetic material can also be CoPt, NiFe, CoCrPt, or the like. The characteristics of the ferromagnetic material can be varied by changing the composition, performing a heat treatment, or the like.

The reference portion 18 has magnetization pinned in the direction indicated by the arrow 19 shown in FIG. 1(b) (the y-axis direction). Also, as will be described later, in the magnetic tube 10, magnetic domains partitioned by domain walls represent stored information in a magnetic memory. Information is written into the memory cells or is read from the memory cells by using a spin torque transfer technique with the reference portion 18. Therefore, the thickness t of the reference portion 18 in the direction (the z-axis direction), in which the magnetic tube 10 extends, is preferably smaller than the later described record length. With a realistic domain wall width being taken into consideration, the thickness t is preferably 10 nm or greater. To achieve high-density recording, the thickness t is preferably 50 nm or smaller. There is a possibility that the magnetization direction of the reference portion 18 is changed by a spin torque that occurs in the magnetic tube 10 when a current is applied. Therefore, the damping coefficient of the reference portion 18 is preferably higher than the damping coefficient of the magnetic tube 10. In this case, the time, required for the reference portion 18 to have a magnetization reversal caused by spin torque transfer, becomes longer. Therefore, in a case where the current flowing period is short enough, the magnetization of the reference portion 18 is not easily reversed.

The intermediate layer 16 is formed with a tunnel insulating film material in this embodiment. The tunnel insulating film material that can be used here is an oxide, a nitride, a fluoride, an oxynitride, or the like containing at least one element selected from aluminum (Al), titanium (Ti), zinc (Zn), zirconium (Zr), tantalum (Ta), cobalt (Co), nickel (Ni), silicon (Si), magnesium (Mg), and iron, for example. Other than that, it is possible to use a semiconductor material with a large energy gap, such as AlAs, GaN, AlN, ZnSe, ZnO, or MgO.

Also, Ta, Ru, Pt, Pd, Ir, Cu, Au, Ag, Cr, or Al can be used as a constituent material in the intermediate layer 16. It is also possible to use an alloy containing at least two of those elements. It is also possible to use an alloy formed by combining one of those elements with some other element. A stack structure of those elements can also be used.

The magnetic tube 10 is formed with a ferromagnetic material, a ferrimagnetic material, or an artificial lattice. The ferromagnetic material that can be used here is an alloy of at least one element selected from Fe, Co, Ni, Mn, and Cr, and at least one element selected from Pt, Pd, Ir, Ru, and Rh. It is also possible to use CoPt, NiFe, or CoCrPt, for example, as the ferromagnetic material. The characteristics of the ferromagnetic material can be varied by changing the composition, performing a heat treatment, or the like.

The ferrimagnetic material that can be used here is an amorphous alloy of a rare earth and a transition metal, such as TbFeCo or GdFeCo. When deposited under chosen manufacturing conditions, those materials tend to have an easy axis of magnetization in the depositing direction, and can be advantageously used to set an easy axis of magnetization in a direction perpendicular to the thin film plane. Also, the exchange stiffness and the intensity of magnetization can be changed by adjusting the composition of the rare-earth element Tb or Gd and the transition metal element Fe or Co, which is beneficial in modulating the behaviors of the domain walls and the magnetic domains in the magnetic tube 10.

The artificial lattice that can be used here is a stack structure of a ferromagnetic material and an alloy of at least one element selected from Pt, Pd, Ir, Ru, Cu, Ag, Au, and Cr. By appropriately choosing manufacturing conditions and the film thickness of each layer, the magnetization of the ferromagnetic layer can be made to have antiferromagnetic arrangement. Accordingly, the intensity of the magnetization of the magnetic tube 10 can be adjusted. The ferromagnetic material that can be used here is an alloy of at least one element selected from Fe, Co, Ni, Mn, and Cr, and at least one element selected from Pt, Pd, Ir, Ru, and Rh. Also, CoPt, NiFe, CoCrPt, or the like can be used as the ferromagnetic material.

Referring now to FIGS. 2(a) through 7(b), the operating principles of the magnetic memory 1 of this embodiment are described.

As shown in FIG. 2(a), the magnetic tube 10 can be magnetized so that magnetic fluxes close in the magnetic tube 10. In FIG. 2(a), showing schematic cross-section illustrations of the magnetic tube 10, the magnetization directions of the magnetic tube 10 are indicated by arrows, and there are two kinds of magnetization directions: the clockwise direction and the counterclockwise direction. The magnetic memory element 1 uses those two states to record information. In this specification, clockwise magnetization indicates the information "0", and counterclockwise magnetization indicates the information "1". Alternatively, clockwise magnetization can indicate the information "1", and counterclockwise magnetization can indicate the information "0".

As shown in FIG. 2(b), the magnetic tube 10 can have a multi-domain state in which some portions of the magnetic tube 10 are magnetized in the clockwise direction and the other portions of the magnetic tube 10 are magnetized in the counterclockwise direction. As shown in FIG. 2(b), each record length is defined in the extending direction of the magnetic tube 10 (the z-axis direction), so that the multi-domain state can be read as the bit sequence. For example, the multi-domain state shown in FIG. 2(b) indicates the bit sequence, "0100101101", counted from above in the z-axis direction. In FIG. 2(b), the blank portions indicate the information "0" and the shaded portions indicate the information "1".

As described above, the magnetic memory element 1 includes the magnetic tube 10, the intermediate layer 16, and the reference portion 18. By using those components, the above described multi-domain state is created, and this domain state (the magnetization direction stored in the magnetic domains) can be converted into an electrical signal. Referring now to FIGS. 3(a) through 3(d), a method of controlling the magnetization of the magnetic tube 10, and a method of converting a domain state into an electrical signal are described.

FIGS. 3(a) and 3(b) illustrate a method of controlling the magnetization of the magnetic tube 10 with current. As is well known, in a structure called a spin valve in which a nonmagnetic metal layer or an insulating layer is interposed between first and second ferromagnetic layers, a current is flowed between the first and second ferromagnetic layers, to generate spin torque caused by the spin-polarized current, and control the magnetization directions of the first and second ferromagnetic layers to be in a parallel state or an antiparallel state. The magnetization of one ferromagnetic layer (the first ferromagnetic layer, for example) of the first and second ferromagnetic layers is fixed in a specific direction by appropriately designing the structure, so that only the magnetization of the other one ferromagnetic layer (the second ferromagnetic layer) is switched when a current is flowed. When a current is flowed to the second ferromagnetic layer from the first ferromagnetic layer having its magnetization fixed (the fixed layer), the magnetization direction of the second ferromagnetic layer is switched to a direction antiparallel to the magnetization of the first ferromagnetic layer. When a current is flowed in the opposite direction from the above mentioned direction, the magnetization of the second ferromagnetic layer is switched to a direction parallel to the magnetization of the first ferromagnetic layer. In the magnetic memory element 1 of this embodiment, the magnetization of the magnetic tube 10 is also controlled by utilizing the same physical phenomenon.

Having an easy axis of magnetization in its own extending direction (the y-axis direction shown in FIG. 1(a)), the reference portion 18 is magnetized in one direction (toward the right in FIGS. 3(a) through 3(d)). The reference portion 18 is formed by selectively using a material with high shape anisotropy and a high damping coefficient, so that the reference portion 18 can substantially function like the fixed layer in a spin valve. That is, the reference portion 18 functions as the electrode that applies a spin-polarized current to the magnetic tube 10. In this specification, the direction in which a write current $I_W$ is flowed to the reference portion 18 from the magnetic tube 10 via the intermediate layer 16 is the positive direction. In a case where a negative write current ($-I_W$) flows between the magnetic tube 10 and the reference portion 18, the spin torque acts, due to the existence of the reference portion 18, in a manner that the magnetization of a portion of the magnetic tube 10 becomes antiparallel to the magnetization of the reference portion 18 (FIG. 3(a)). In a case where the write current is a positive write current ($I_W$), on the other hand, the spin torque acts in a manner that the magnetization of the portion of the magnetic tube 10 becomes parallel to the magnetization of the reference portion 18 (FIG. 3(b)). This is utilized in the magnetic memory 1 of this embodiment in the following manner. When the magnetization of the portion of the magnetic tube 10 adjacent to the reference portion 18 is to be changed from "1" to "0", the negative write current ($-I_W$) is applied, so that the magnetization direction of the portion of the magnetic tube 10 is changed from the parallel direction (the direction indicated by a dashed line) to the antiparallel direction (the direction indicated by a solid line), as shown in FIG. 3(a). In this manner, information is written. Also, as shown in FIG. 3(b), when the magnetization of the portion is to be changed from "0" to "1", the positive write current ($I_W$) is applied, so that the magnetization direction of the portion of the magnetic tube 10 is changed from the antiparallel direction (the direction indicated by a dashed line) to the parallel direction (the direction indicated by a solid line). In this manner, information is written.

To read information, a tunnel magnetoresistive effect (TMR effect) is used to convert the magnetization direction of the portion of the magnetic tube 10 adjacent to the reference portion 18 into an electrical signal. In the magnetic memory 1 of this embodiment, the magnetic tube 10 and the reference portion 18 are separated from each other by the intermediate layer 16 made of an insulator, and the current flow between the magnetic tube 10 and the reference portion 18 is a tunneling current, as in a spin valve. Accordingly, in a case where the magnetization of the magnetic tube 10 is antiparallel to the magnetization of the reference portion 18, the resistance between the magnetic tube 10 and the reference portion 18 is higher than in a case where the magnetization of the magnetic tube 10 is parallel to the magnetization of the reference portion 18. In the structure illustrated in FIGS. 3(c) and 3(d), when the portion of the magnetic tube 10 being adjacent to the reference portion 18 has magnetization in the direction indicating "0", the resistance between the magnetic tube 10 and the reference portion 18 is in a high-resistance state. When the portion has the magnetization indicating "1", the resistance is in a low-resistance state. The voltage that drops between the magnetic tube 10 and the reference portion 18 when a current is applied between the magnetic tube 10 and the reference portion 18 is used as a read signal.

In the magnetic memory 1 of this embodiment, the magnetic domains accompanied by the domain walls generated by the above described write operation need to be made to shift in the magnetic tube 10. In the magnetic memory 1, a current is flowed to the magnetic tube 10 so that the domain walls shift, as shown in FIGS. 4(a) through 4(e). FIG. 4(a) shows the magnetic tube 10 in which the blank portions indicate "0" and the shaded portions indicate "1". The portions between the blank portions and the shaded portions are the domain walls. In the domain walls, the magnetization direction is skewed.

As shown in FIG. 4(b), when a current is applied from top to bottom in the drawing, the domain walls shift upward. The electrons flowing from bottom to top induce spin torque exerted on the domain walls where the magnetization is skewed. The spin torque in a domain wall, through which electrons flow, functions to adjust magnetization of a magnetic domain receiving the flow from the domain wall to magnetization direction of another magnetic domain forwarding the flow to the domain wall. As a result, the domain walls are made to shift by current while maintaining the sizes thereof or maintaining the lengths of the magnetic domains (the record lengths) in the extending direction of the magnetic tube 10. As shown in FIG. 4(c), the domain walls continue to shift while current is being applied. As shown in FIGS. 4(d) and 4(e), the shifting direction of the domain walls is reversed by switching the directions of the current being applied. By combining the above described write operation, read operation, and shift operation, information can be stored into the magnetic memory 1, or information can be read from the magnetic memory 1.

(Initializing Operation)

The magnetization arrangement of the magnetic tube 10 immediately after the magnetic memory 1 is manufactured might change due to diverse factors, and therefore, cannot be predicted. In view of this, the magnetization of the magnetic tube 10 needs to be initialized prior to use.

In the case of a magnetic domain wall memory using magnetic nanowires, an external magnetic field is applied to set the magnetization directions of the nanowires in one direction. In principle, initialization is performed in this manner.

In the magnetic tube 10 of this embodiment, on the other hand, the magnetic fluxes close in the tube 10. Therefore, even if an external magnetic field is applied, a uniform magnetization state cannot be achieved. In view of this, the write operation and the shift operation are combined as shown in FIGS. 5(a) through 5(e), to initialize the magnetic tube 10. In the magnetic tube 10 prior to initialization, the magnetization state is difficult to predict, as shown in FIG. 5(a). A current is then flowed to the magnetic tube 10 from the reference portion 18, to change the magnetization of the portion of the magnetic tube 10 adjacent to the reference portion 18 into the state "1" (FIG. 5(b)). If this portion is already in the state "1" prior to the current flowing, no change occurs. A negative shift current ($-I_S$) is then flowed to the magnetic tube 10, to cause the domain walls to shift downward in the drawing by the record length (FIG. 5(c)). In this specification, a shift current $I_S$ flowing from top to bottom in FIG. 5(e) is positive, and a shift current $-I_S$ flowing from bottom to top in FIG. 5(c) is negative. These two operations are repeated until the lower end of the magnetic tube 10 is certainly put into the state "1" (FIG. 5(d)). In FIGS. 5(a) through 5(e), the magnetic tube 10 has a length equivalent to 6 bits (six magnetic domains and six domain walls) between the reference portion 18 and the lower end, and therefore, those two operations need to be repeated six times. Lastly, the shift current $I_S$ is applied for a sufficiently long period of time for the domain wall reaches the upper end of the magnetic tube 10. The entire magnetic tube 10 is then put into the state "1". In this manner, the magnetic memory 1 can be initialized.

Figure 6:
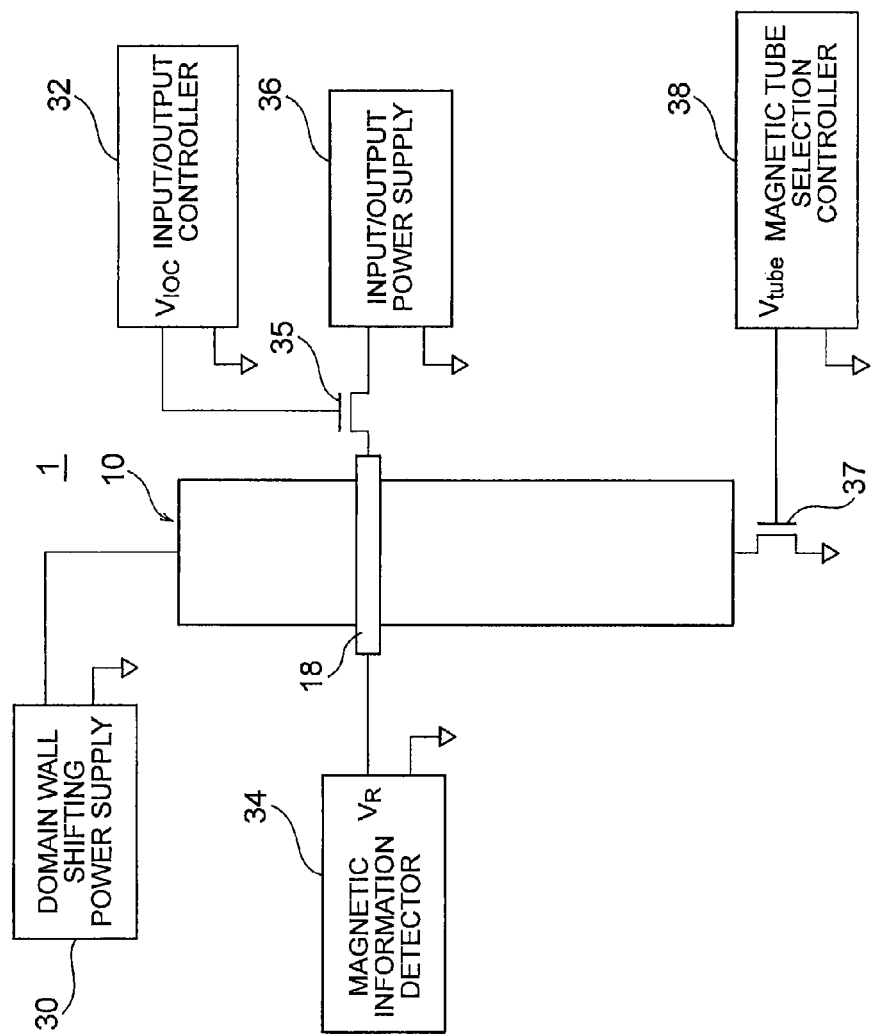
FIG. 6 is a diagram showing peripheral circuits connected to the magnetic memory.
Figure 7:
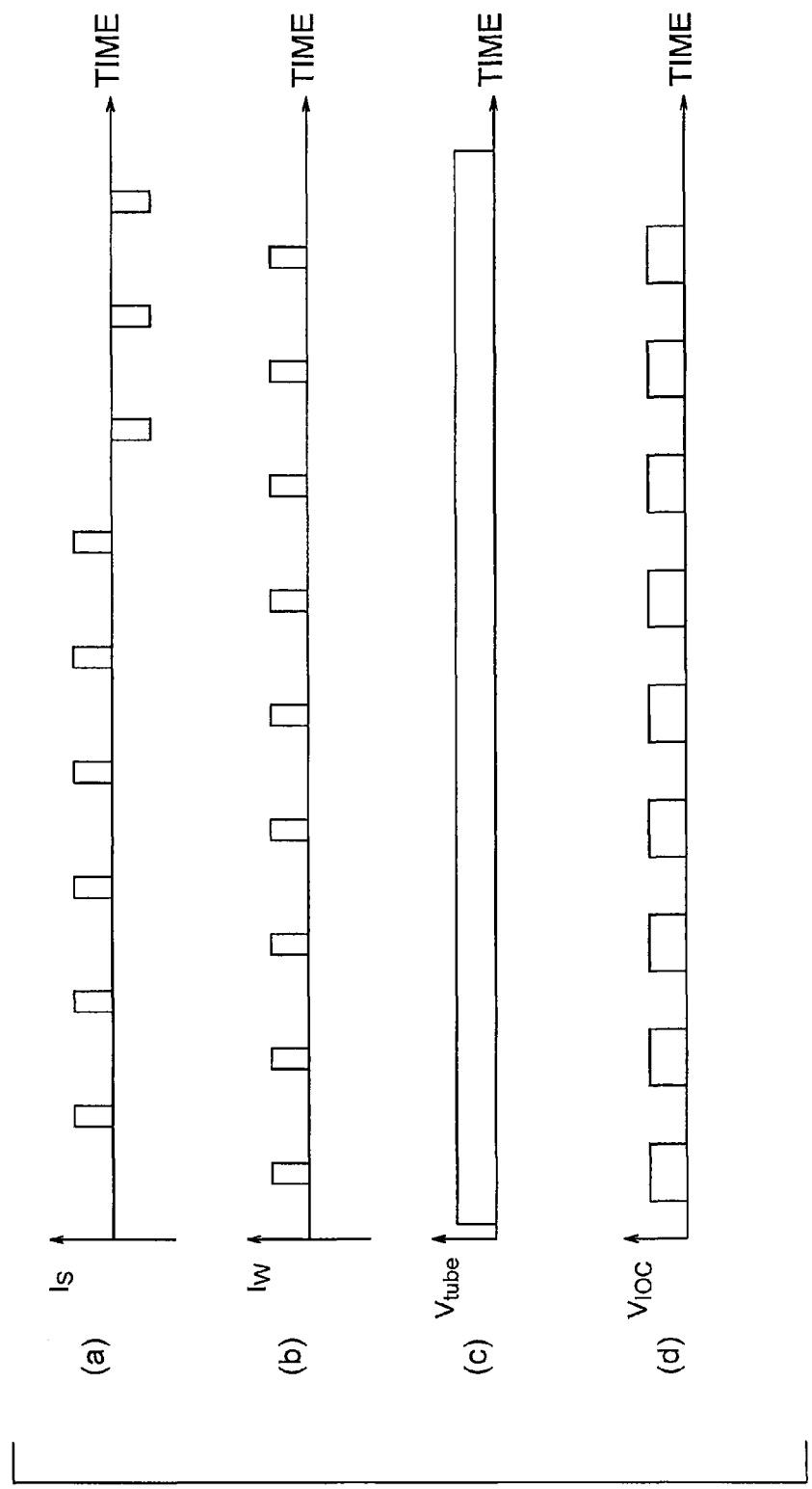
FIGS. 7(a) through 7(d) are timing charts illustrating an example of an initializing operation.
Figure 8:
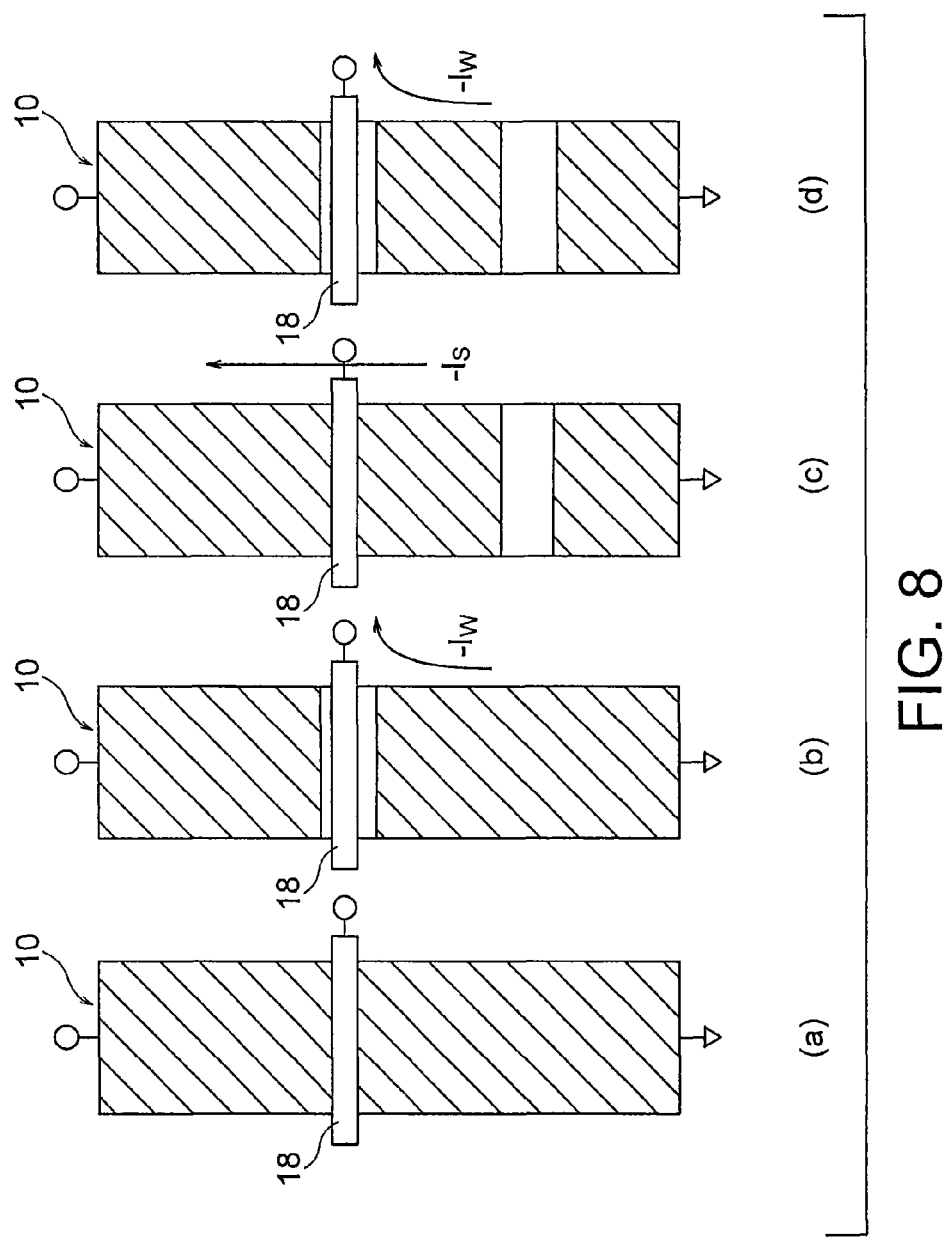
FIGS. 8(a) through 8(d) are diagrams for explaining a write operation.
Figure 9:
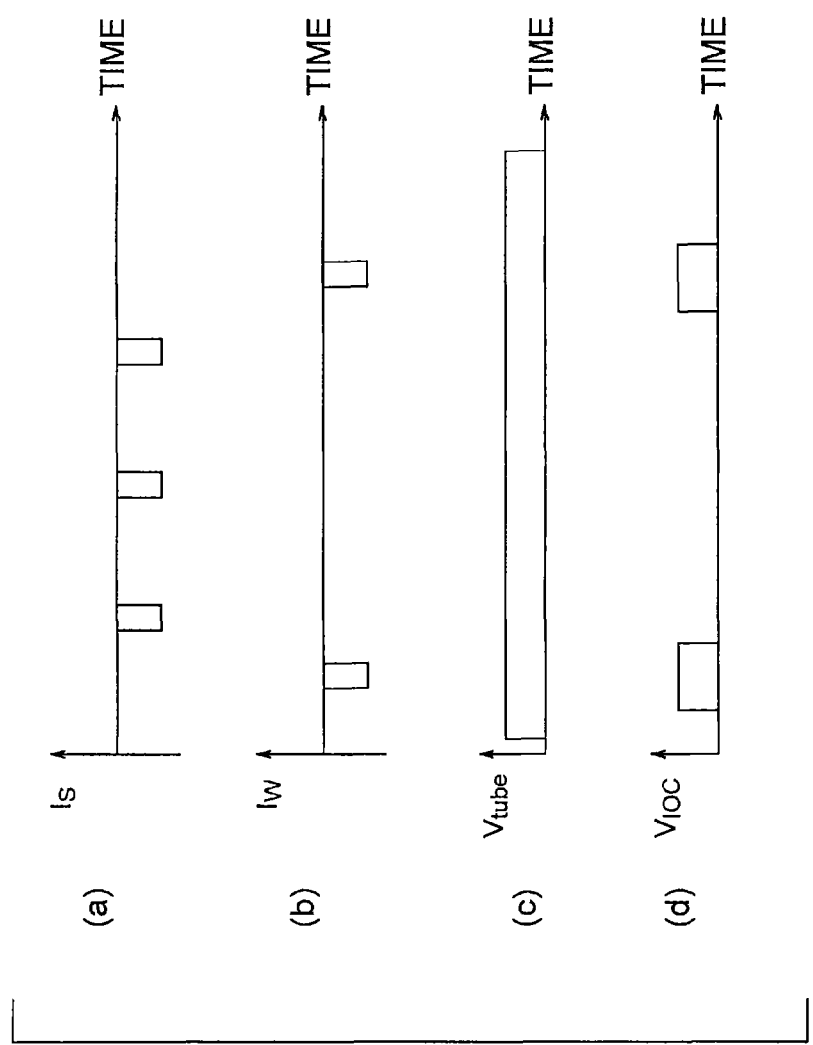
FIGS. 9(a) through 9(d) are timing charts illustrating an example of the write operation.
Figure 10:
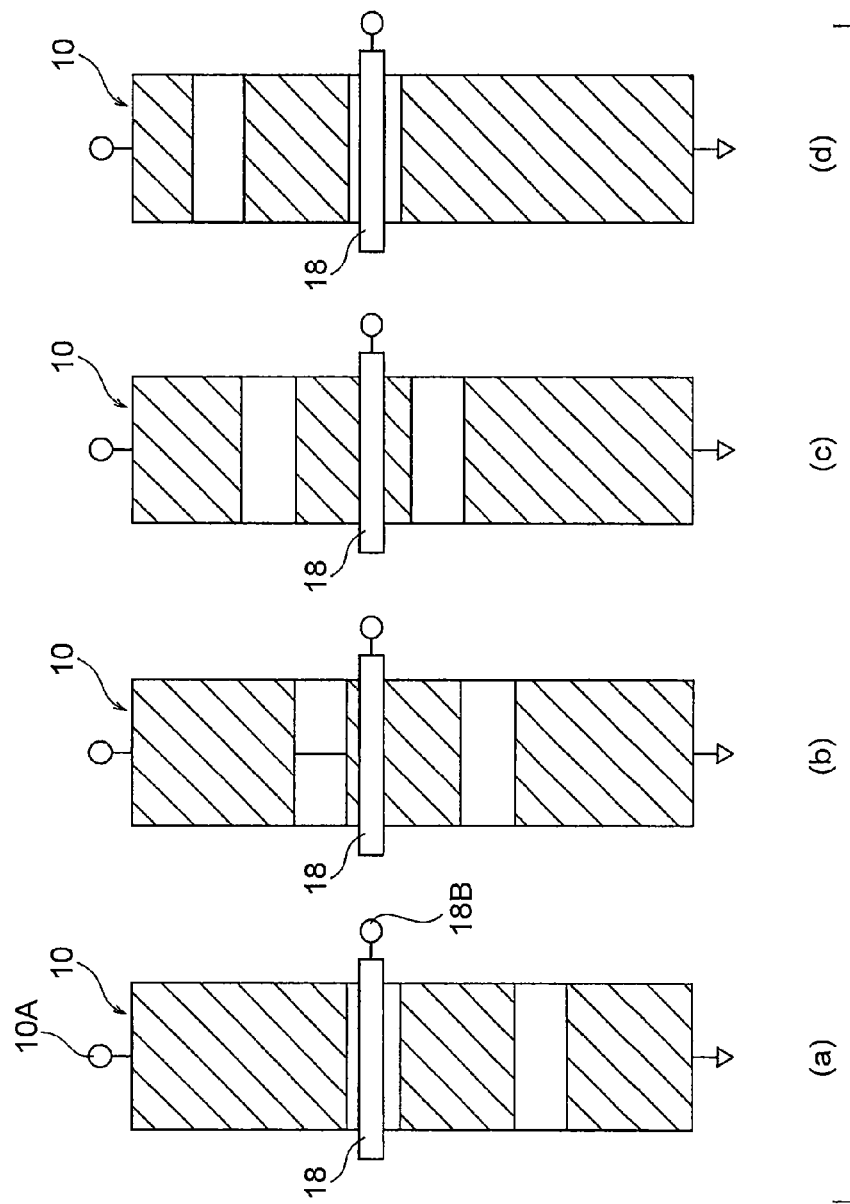
FIGS. 10(a) through 10(d) are diagrams for explaining a read operation.

This initializing operation can be realized by connecting the magnetic memory 1 to the circuits shown in FIG. 6, which are a domain wall shifting power supply 30, an input/output controller 32, a magnetic information detector 34, an input/output power supply 36, and a magnetic tube selection controller 38, for example. The domain wall shifting power supply 30 has a bipolar output, and can selectively flow a positive current or a negative current where necessary. A transistor 35 is provided between the reference portion 18 and the input/output power supply 36. The channel of the transistor 35 is put into a conduction state by a voltage signal from the input/output controller 32 connected to the gate electrode of the transistor 35, so that a current can be flowed to the reference portion 18 from the input/output power supply 36. The input/output power supply 36 also has a bipolar output. A transistor 37 is also provided between the magnetic tube 10 and the ground line, and no current is flowed to the magnetic tube 10 unless a voltage signal $V_{tube}$ from the magnetic tube selection controller 38 is applied to the gate terminal of the transistor 37.

In this structure, the above described initializing operation can be realized by supplying the time-series signals shown in FIGS. 7(a) through 7(d), for example, to the magnetic tube 10 and the two transistors 35 and 37. FIGS. 7(a) through 7(d) are timing charts showing the timings to flow the positive write current $I_W$ to respective memory cells, or the timings to write the information "1" into the respective memory cells.

During the initializing operation, a shift or write pulse current needs to be flowed to the magnetic tube 10. Therefore, the voltage signal $V_{tube}$ is constantly applied the transistor 37 (FIG. 7(c)). The write current $I_W$ is flowed while a voltage signal $V_{IOC}$ from the input/output controller 32 is supplied (FIG. 7(b) and FIG. 7(d)).

(Write Operation)

The magnetic memory 1 can be made to function as a memory by combining the above described initializing operation, write operation, and shift operation. Referring now to FIGS. 8(a) through 8(d) and FIGS. 9(a) through 9(d), this mechanism is described. First, the magnetization in the magnetic tube 10 is made uniform by using the above described initializing operation (FIG. 8(a)). At this point, the magnetization in the magnetic tube 10 is uniform in the counterclockwise direction when seen from top of the drawing, and is in the state "1". When the negative write current ($-I_W$) is flowed between the magnetic tube 10 and the reference portion 18 in this situation, the magnetization of the portion of the magnetic tube 10 being adjacent to the reference portion 18 is reversed and is put into the state "0" (FIG. 8(b)). The negative shift current ($-I_S$) is then flowed, to move the domain walls (the magnetic domains) downward in the magnetic tube 10 by the length equivalent to 3 bits (triple record length) (FIG. 8(c)). The current flowed can provide three pulses each having such a duration as to cause a 1-bit shift, or a constant current can be continuously flowed and be cut off when a 3-bit shift has been achieved. Further, the negative write current ($-I_W$) is again flowed between the magnetic tube 10 and the reference portion 18, to reverse the magnetization of the portion of the magnetic tube 10 adjacent to the reference portion 18 (FIG. 8(d)). Through the above described operation, 4-bit information "0110" is stored into the magnetic tube 10.

This operation can be illustrated in timing charts as shown in FIGS. 9(a) through 9(d), for example. Since initialization is performed beforehand, there is no need to flow a current to write the information "1", and only the shift current $I_S$ for moving domain walls is flowed to the tube 10 (FIGS. 9(a) and 9(b)).

(Read Operation)

Referring now to FIGS. 10(a) through 10(e) and FIG. 11, an example of a method of reading information stored in the magnetic tube 10 is described. In the magnetic memory 1 of this embodiment, information stored in the magnetic tube 10 is read by using the tunnel magnetoresistance appearing between the reference portion 18 and the magnetic tube 10. Here, it is assumed that the reference portion 18 is magnetized rightward in the drawing, as in FIGS. 1(a) and 1(b). In the situation illustrated in FIG. 10(a), the magnetization of the reference portion 18 and the magnetization of the portion of the magnetic tube 10 being adjacent to the reference portion 18 are antiparallel to each other. Therefore, the resistance between a terminal 10A of the magnetic tube 10 and a terminal 18B of the reference portion 18 has a relatively high value.

Figure 11:
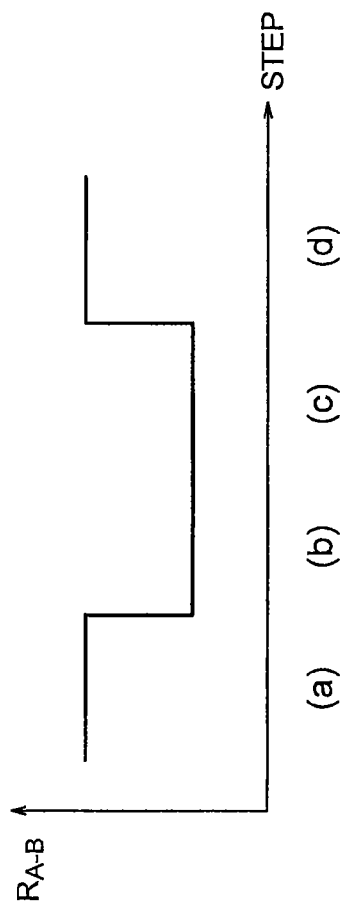
FIG. 11 is a timing chart illustrating the read operation shown in FIGS. 10(a) through 10(d)
Figure 12:
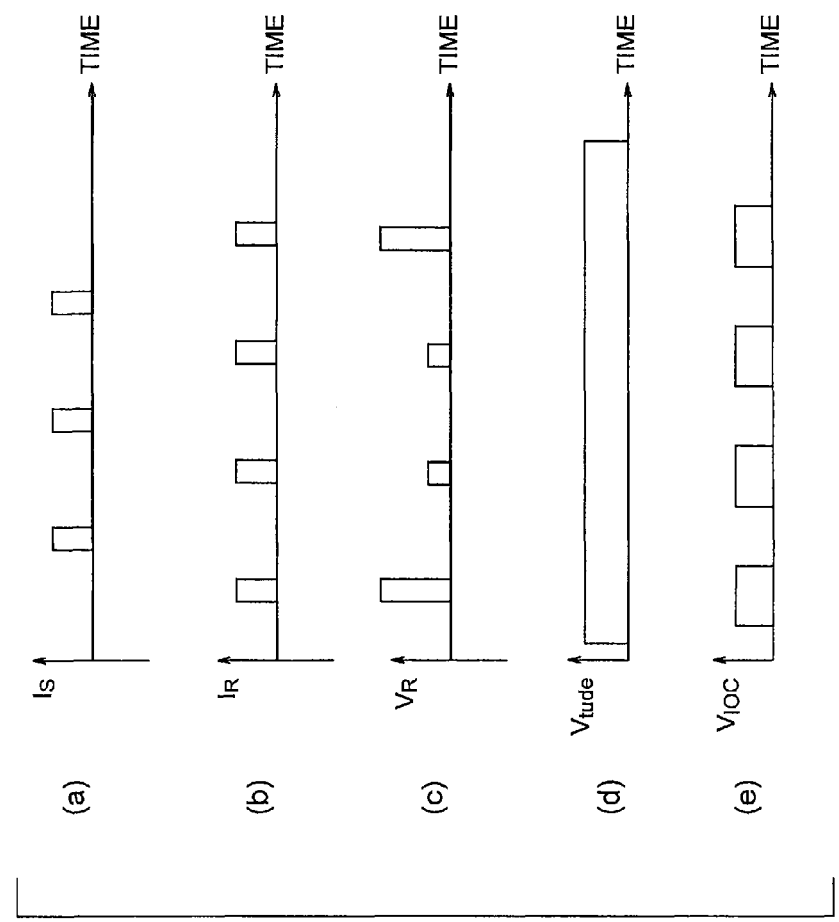
FIGS. 12(a) through 12(e) are timing charts illustrating an example of the read operation.

When the shift current $I_S$ is flowed to the magnetic tube 10 to cause the domain walls to shift upward in the drawing by one bit, the magnetization of the reference portion 18 and the magnetization of the portion of the magnetic tube 10 adjacent to the reference portion 18 become parallel to each other. Accordingly, the tunnel magnetoresistance becomes lower, and the resistance between the terminal 10A and the terminal 18B becomes lower than in a case where the magnetization arrangement is an antiparallel state (FIG. 10(b)). On each step, the shift current is flowed to cause the domain wall locations to shift by one bit, and then the resistance between the terminal 10A and the terminal 18B is measured. In this manner, the information stored in the magnetic tube 10 is read (FIGS. 10(c) and 10(d)). FIG. 11 shows the information read through the steps illustrated in FIGS. 10(a) through 10(d), or the resistance between the terminal 10A and the terminal 18B. As described above, On each step, the shift current is flowed to cause the domain wall locations to shift by one bit, and then the resistance between the terminal 10A and the terminal 18B is measured. In this manner, the information stored in the magnetic tube 10 can be read. The order of the information read through this read operation is the reverse of the order of the information stored into the magnetic tube 10. Accordingly, the magnetic memory 1 functions as a LIFO (Last-In First-Out) sequential access information storage element.

This read operation can be illustrated in timing charts as shown in FIGS. 12(a) through 12(e), for example. To read magnetic information out, a read current $I_R$ is flowed to the magnetic tube 10 from the input/output power supply 36 via the reference portion 18. The voltage drop $V_R$ at this point is sensed by the magnetic information detector 34, and is converted into magnetic information. Here, the flowed read current $I_R$ needs to be lower than the write current $I_W$, and the read current $I_R$ is 1/10 of the write current $I_W$, for example.

(Method of Manufacturing the Magnetic Memory)

Figure 13:
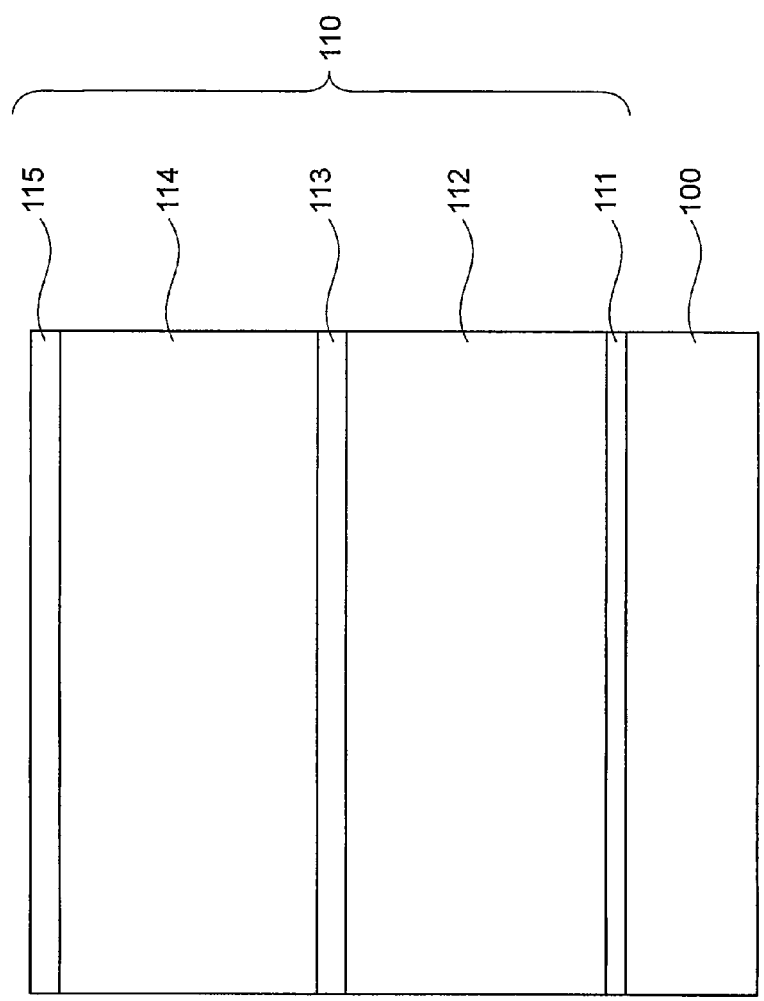
FIG. 13 is a front view illustrating a procedure for manufacturing the magnetic memory of the first embodiment.
Figure 14:
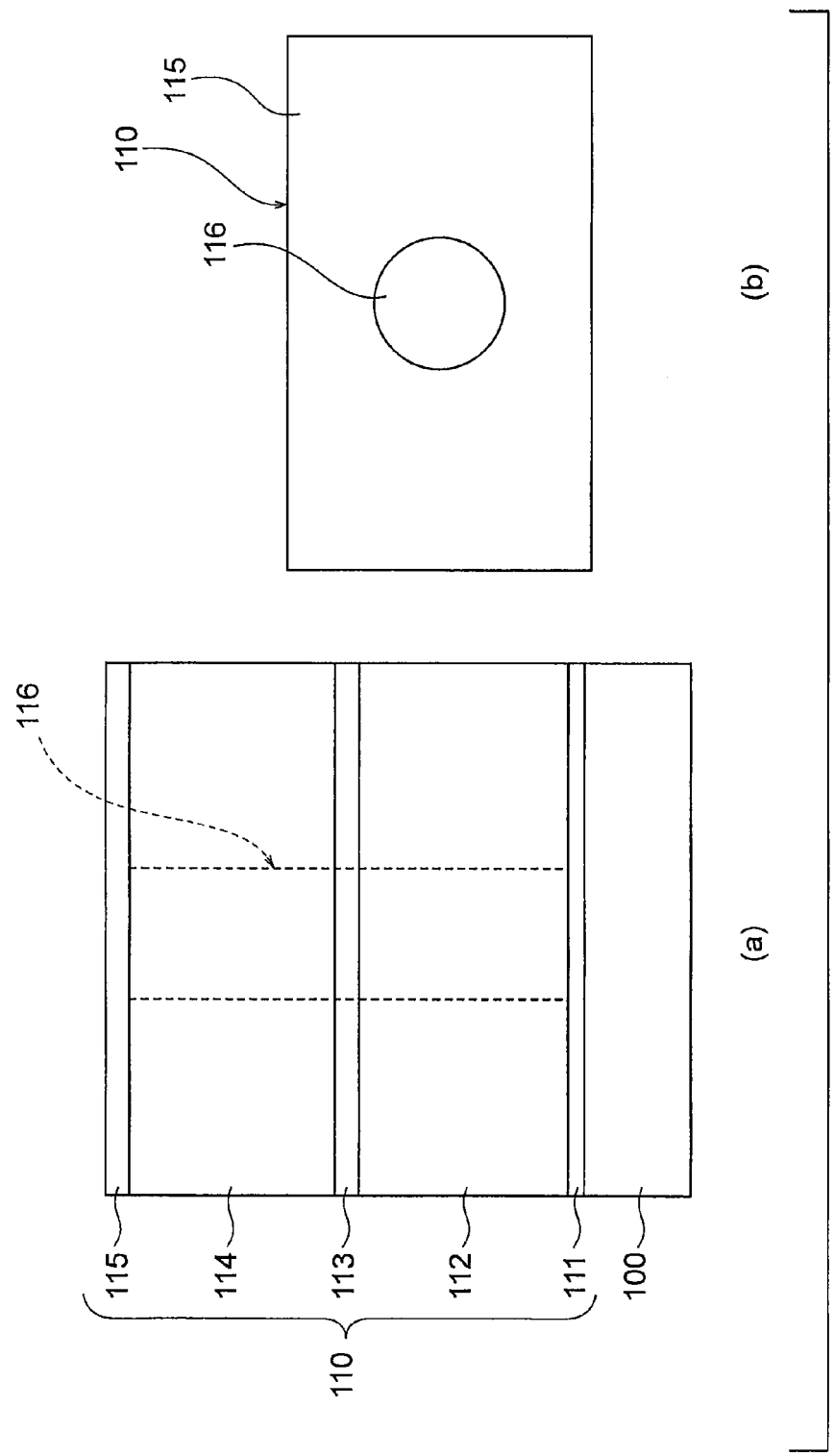
FIGS. 14(a) and 14(b) are diagrams illustrating a procedure for manufacturing the magnetic memory of the first embodiment.
Figure 15:
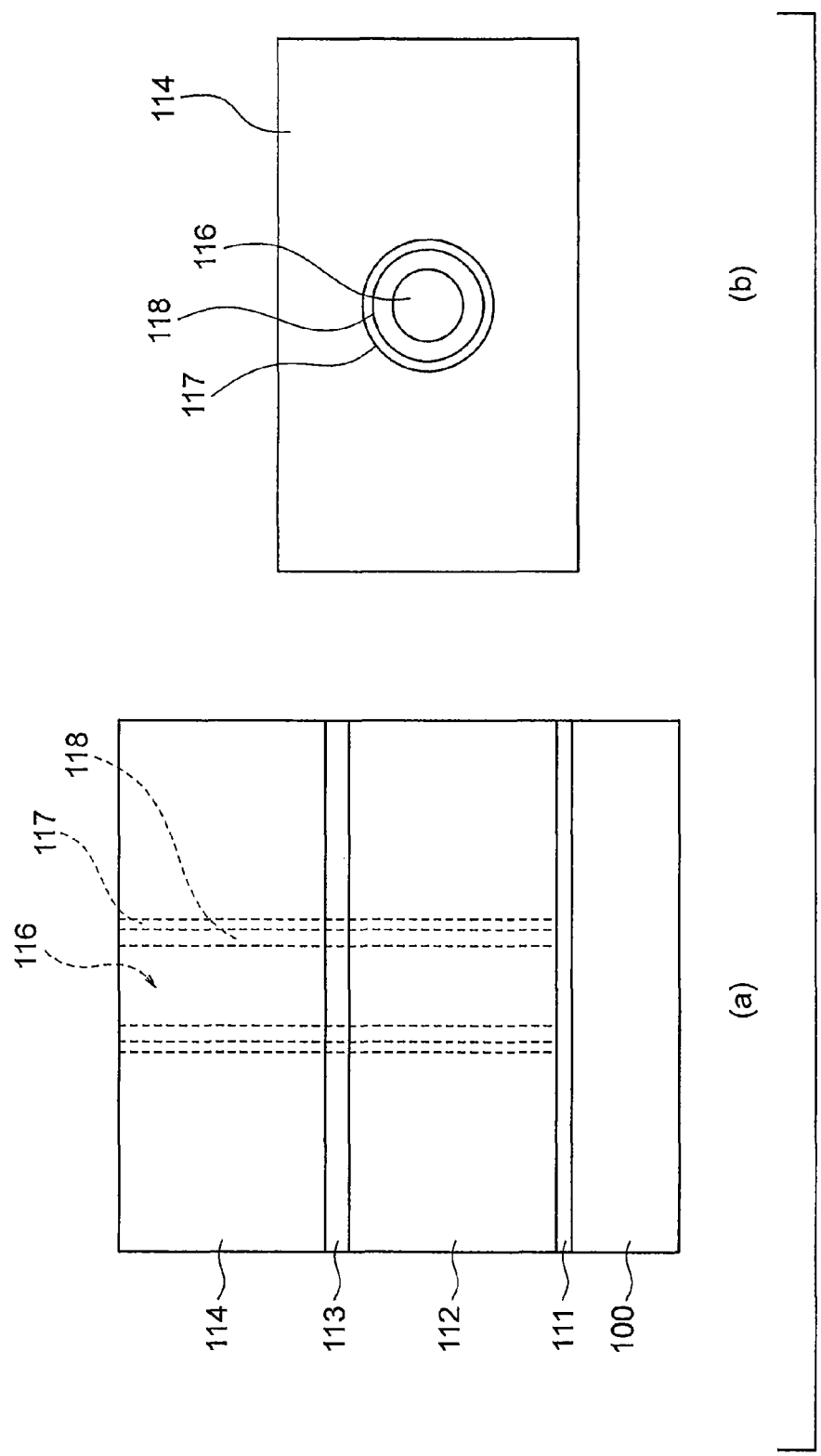
FIGS. 15(a) and 15(b) are diagrams illustrating a procedure for manufacturing the magnetic memory of the first embodiment.
Figure 16:
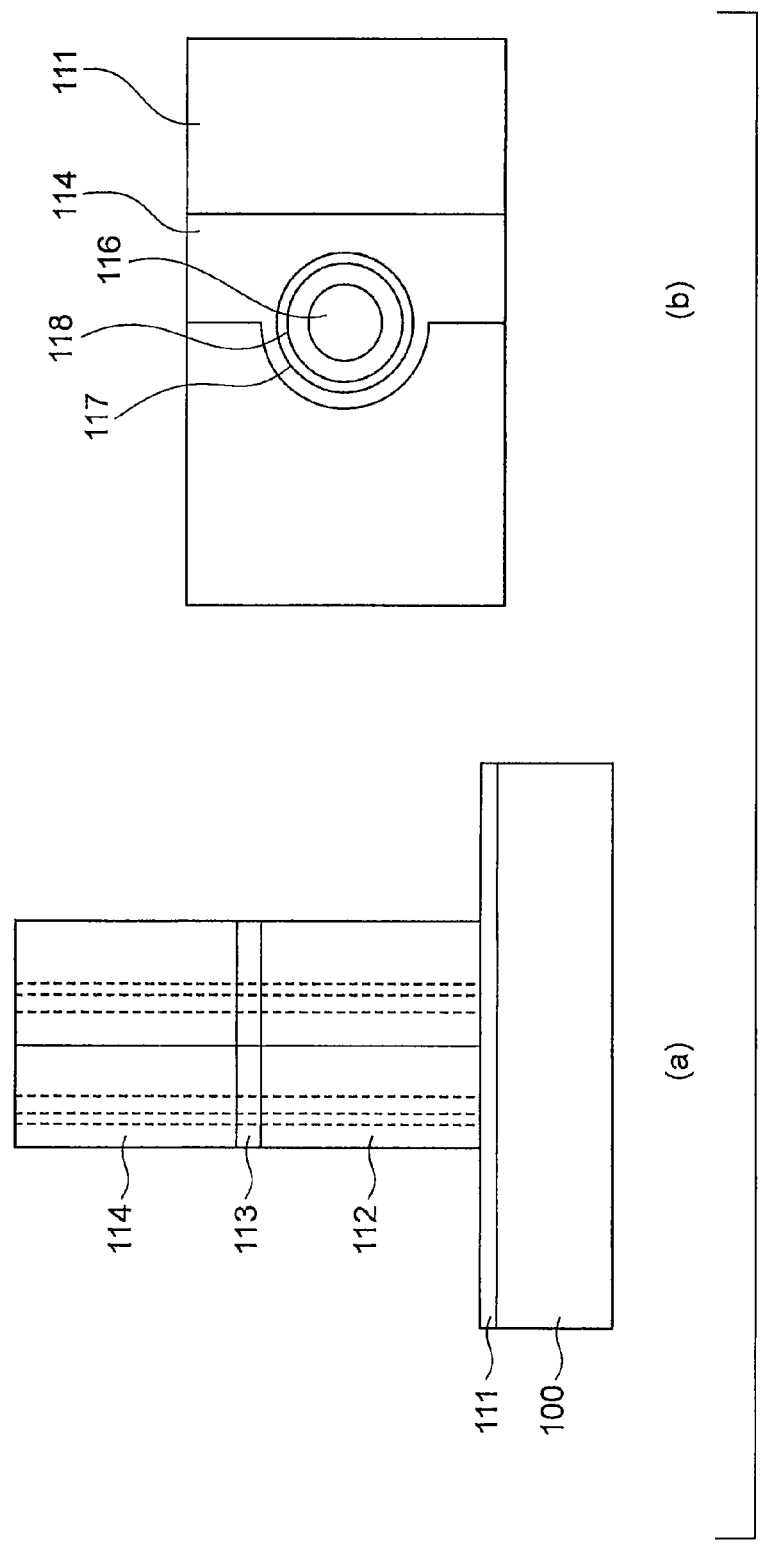
FIGS. 16(a) and 16(b) are diagrams illustrating a procedure for manufacturing the magnetic memory of the first embodiment.
Figure 17:
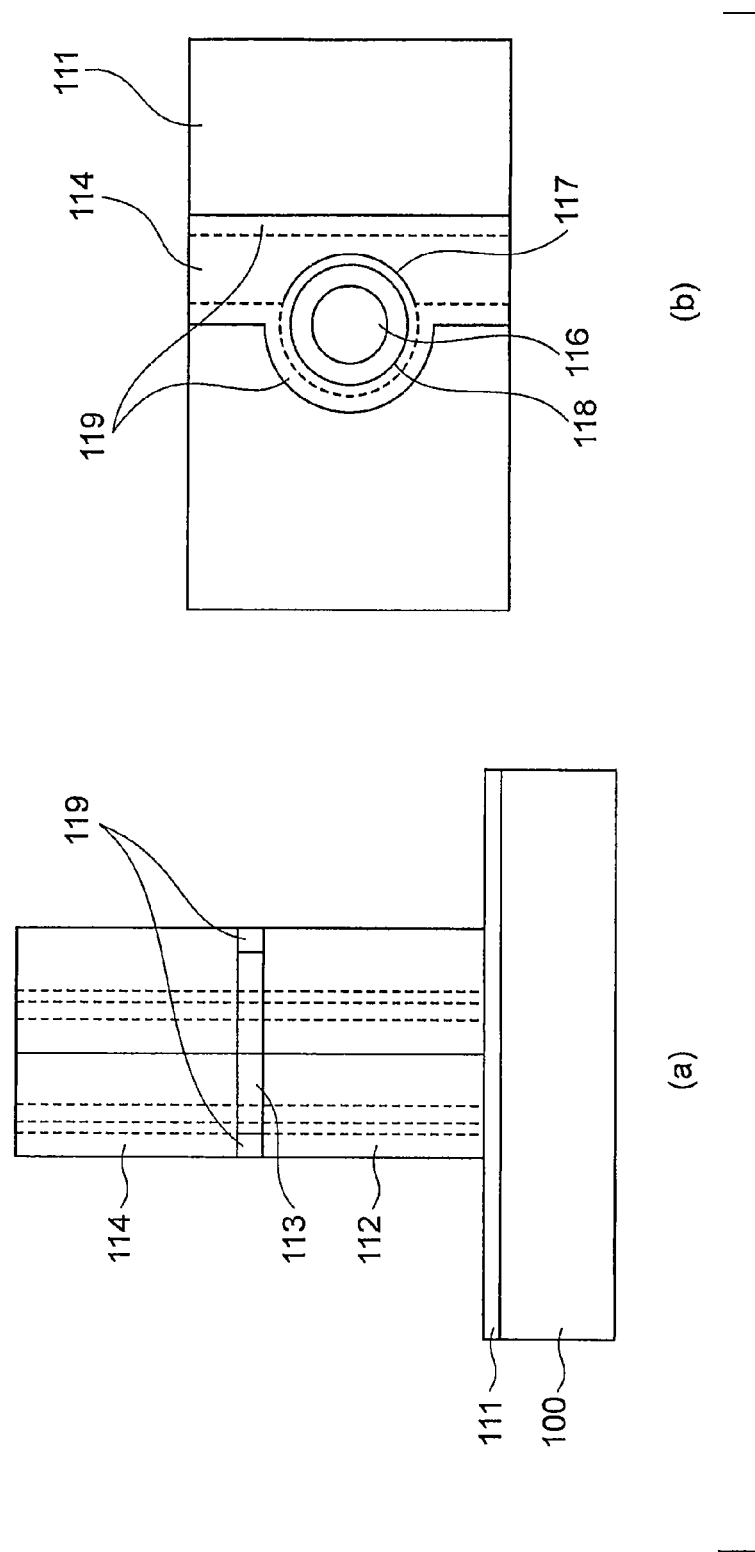
FIGS. 17(a) and 17(b) are diagrams illustrating a procedure for manufacturing the magnetic memory of the first embodiment.

The magnetic memory 1 of this embodiment is manufactured through procedures as illustrated in FIGS. 13 through 17(b). First, as shown in FIG. 13, a wafer substrate 100 that is made of silicon and has a thermally-oxidized film (not shown) formed on the surface thereof is prepared. A multilayer film 110 is then formed on the wafer substrate 100 by using an ultrahigh vacuum sputtering apparatus. The multilayer film 110 is formed by stacking a lower interconnect 111 formed with a Ta foundation layer and a Cu layer, a supporting material layer 112 formed with silicon oxide, a reference-portion magnetic layer 113 that is to be the reference portion and is formed with CoFeB, a supporting material layer 114 formed with silicon oxide, and a metal Al layer (a mask material layer) 115 to be the mask at the time of etching, in this order (FIG. 13). FIG. 13 is a front view of the wafer having the multilayer film 110 formed therein.

A resist layer (not shown) is formed by applying a negative resist onto the multilayer film 110 formed as above. After that, the resist layer is exposed by an ArF immersion exposure apparatus, and is developed to form a circular hole in the resist layer. The wafer is then put into a reactive ion etching apparatus (hereinafter also referred to as the RIE apparatus). The pattern of the resist layer is transferred onto the metal Al layer 115 by using a reactive gas mainly containing a $BCl_3$ gas, and a circular hole is formed in the metal Al layer 115. After that, the wafer is taken out from the RIE apparatus. The resist layer is removed through a wet process, and the wafer is again put into the RIE apparatus. With the metal Al layer 115 serving as a mask, a vertical hole is formed in the silicon oxide layer 114 through a deep-RIE process using a $CHF_3$ gas. This process is temporarily stopped when the vertical hole reaches the reference-portion magnetic layer 113. The reactive gas is then switched back to the gas mainly containing $BCl_3$, and the vertical hole is also formed in the reference-portion magnetic layer 113. When the vertical hole penetrates through the reference-portion magnetic layer 113, the reactive gas is switched to the gas mainly containing $CHF_3$, and the vertical hole 116 is formed in the silicon oxide layer 112 through the resumed deep-RIE process, until the vertical hole 116 reaches the lower interconnect 111 (FIGS. 14(a) and 14(b)). FIGS. 14(a) and 14(b) are a front view and a top view of the wafer.

The wafer is then put into an atomic layer deposition apparatus (hereinafter also referred to as the ALD apparatus), and a Mg layer is formed uniformly on the entire wafer surface including the vertical hole 116. After the deposition of the Mg layer, the wafer is put into an ultrahigh vacuum apparatus, without being exposed to the air. The wafer surface is irradiated with oxygen plasma, so that a Mg oxide film 117 is formed on the entire wafer surface including the vertical hole 116. The wafer is again put into the ALD apparatus, without being exposed to the air. A CoFeB layer 118 is then formed uniformly on the entire wafer surface including the vertical hole 116. The wafer taken out from the ALD apparatus is subjected to a chemical mechanical polishing (CMP) process, so that the excess CoFeB layer and the excess Mg oxide layer formed on the wafer, and the metal Al layer 115 as the mask are removed (FIGS. 15(a) and 15(b)). FIGS. 15(a) and 15(b) are a front view and a top view of the wafer having the metal Al layer 115 removed therefrom.

A resist is again applied, to form a resist layer (not shown). The wafer is then put into the ArF immersion exposure apparatus. At this point, the pattern formed by superimposing the shapes of the magnetic tube and the reference portion on each other is exposed and developed. The wafer is then put into an Ar ion milling apparatus, and milling is performed with the resist layer serving as a mask. The milling is continued until the upper surface of the lower interconnect 111 is exposed. After that, the wafer is taken out from the ion milling apparatus (FIGS. 16(a) and 16(b)). FIGS. 16(a) and 16(b) are a front view and a top view of the wafer.

The wafer is put into an oxidation apparatus, with the resist layer remaining thereon. An oxidation process is performed on the wafer until all the arc-like portion of the reference-portion magnetic layer 113 is oxidized to form an oxide layer 119, as shown in FIGS. 17(a) and 17(b). As a result, the magnetic memory 1 of the first embodiment is formed. FIGS. 17(a) and 17(b) are a front view and a top view of the wafer.

Materials with thermal expansion coefficients largely different from each other are used as the material 118 forming the magnetic tube and the material forming the supporting material layers 112 and 114. In this manner, the magnetic tube is made to have anisotropy in the long-axis direction (the extending direction of the magnetic tube) via a magnetostrictive effect by utilizing the difference in stress applied to the magnetic tube between at the manufacturing temperature and at room temperature. Thus, operation stability can be achieved. For example, in a case where a magnetic tube having an inner diameter of 50 nm and a thickness of 5 nm is formed with a ferromagnetic material of 800 emu/cc in intensity of magnetization, the z-axis direction is the hard axis of magnetization, and the energy difference should be approximately $5 \times 10^6$ emu/cc or larger.

As described above, the magnetic memory 1 of the first embodiment can be manufactured by a simpler manufacturing method than a method of manufacturing a conventional magnetic domain wall memory, and accordingly, the manufacturing costs can be lowered.

Figure 18:
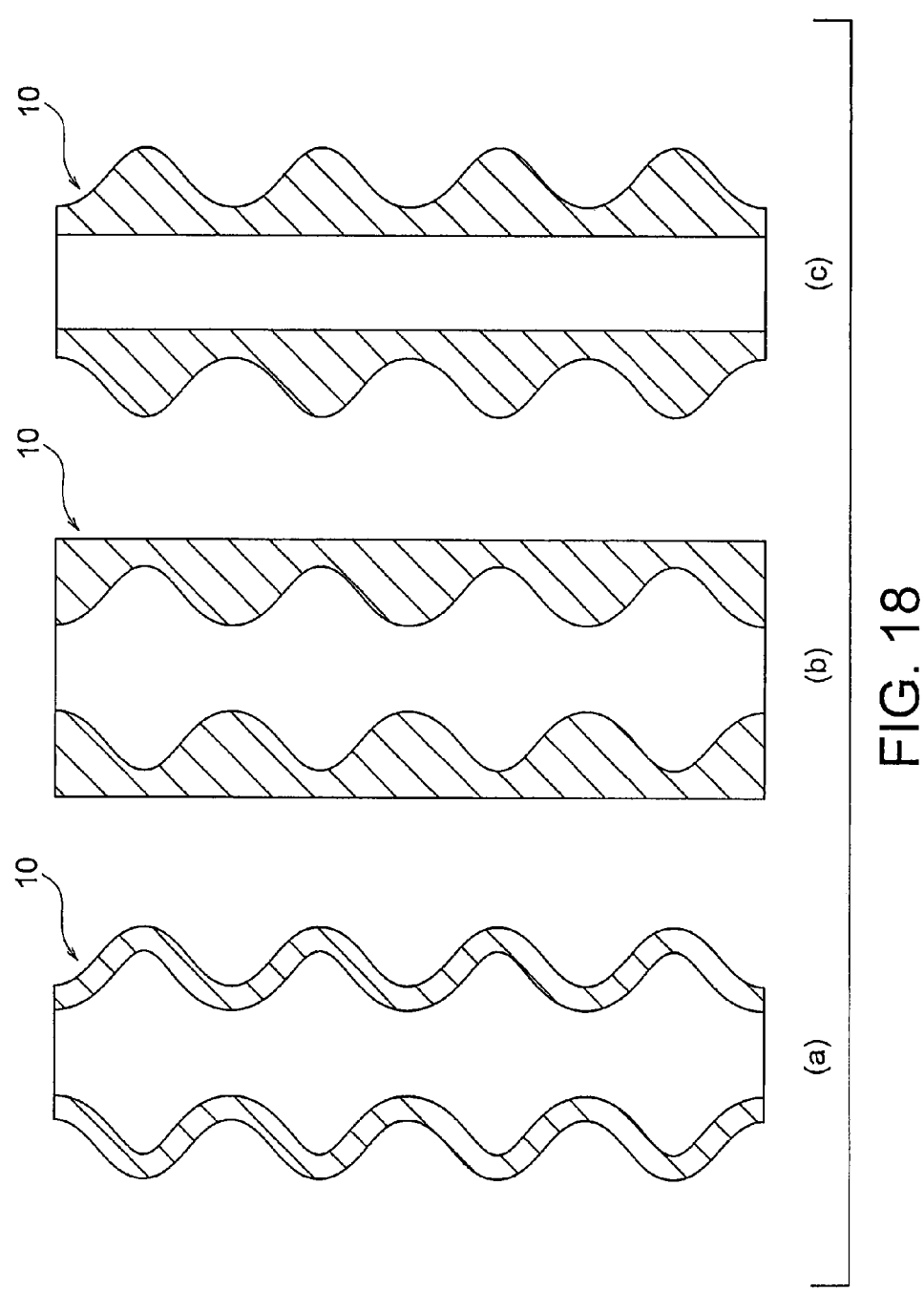
FIGS. 18(a) through 18(c) are diagrams showing examples of transverse cross-sectional shapes of magnetic tubes.
Figure 19:
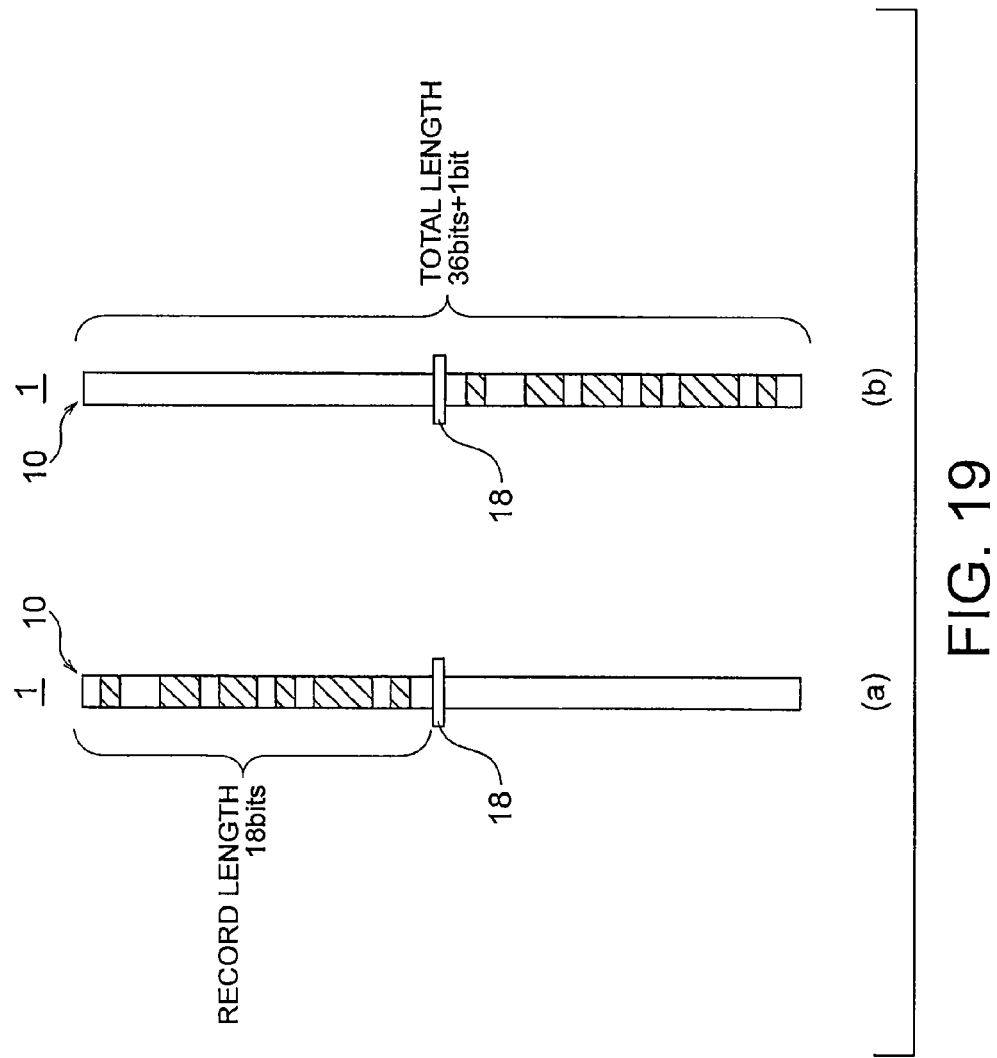
FIGS. 19(a) and 19(b) are schematic views showing the magnetic memory according to the first embodiment.
Figure 20:
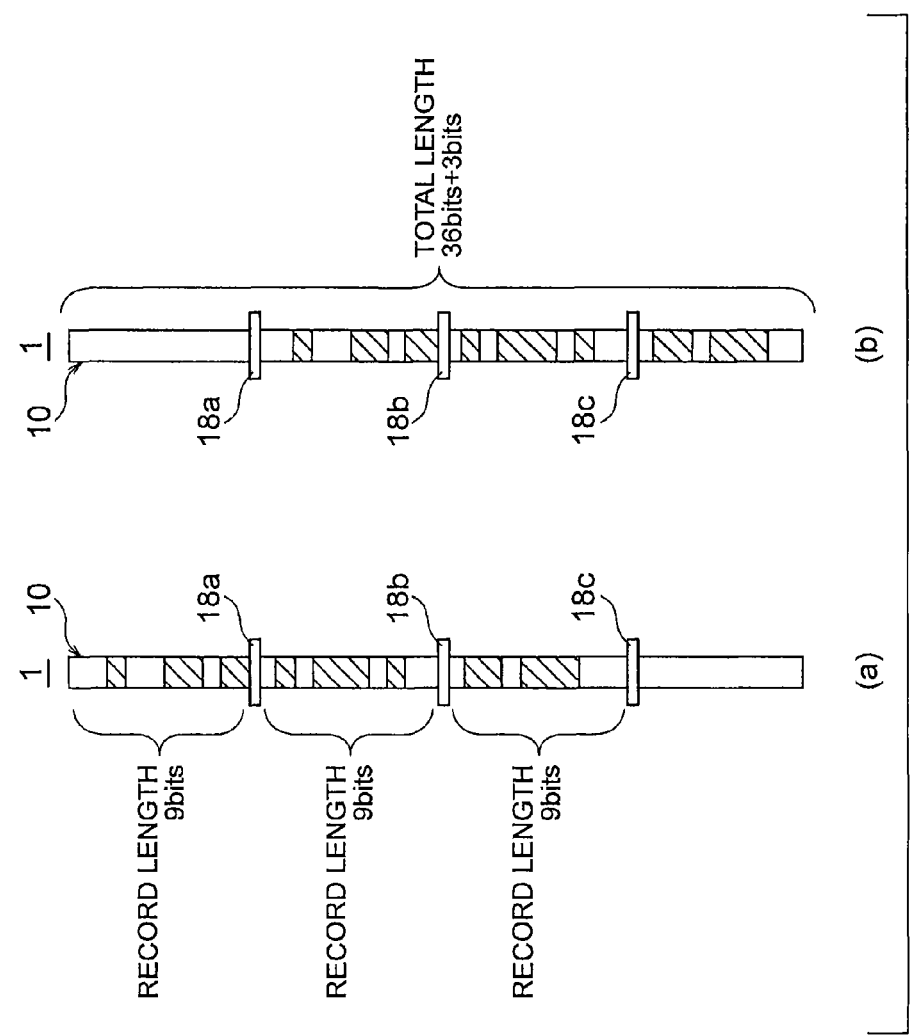
FIGS. 20(a) and 20(b) are schematic views showing the magnetic memory according to a second embodiment.

In the first embodiment, the magnetic tube 10 has a circular ring-like shape in transverse section (a cross-section parallel to the x-y plane shown in FIG. 1(a)), and the sizes (diameters) of the outer shape and the inner shape are both constant, as shown in FIGS. 1(a) and 1(b). That is, the outer shape and the inner shape are fixed circular ring-like shapes. The shape of the magnetic tube 10 is not limited to the shape shown in FIGS. 1(a) and 1(b). For example, the magnetic tube 10 can have any of cyclic shapes shown in FIGS. 18(a) through 18(c). FIG. 18(a) is a vertical cross-sectional view (a cross-section parallel to the y-z plane shown in FIG. 1(a)) of a first example of the magnetic tube 10. In this first example, a transverse section (a cross-section parallel to the x-y plane shown in FIG. 1(a)) of the magnetic tube 10 has a circular ring-like shape and has a constant thickness, as in the first embodiment. However, the inner and outer sizes cyclically vary in the extending direction of the magnetic tube 10 (the z-axis direction shown in FIG. 1(a)) (FIG. 18(a)). FIG. 18(b) is a vertical cross-sectional view of a second example of the magnetic tube 10. In this second example, a transverse section of the magnetic tube 10 has a circular ring-like shape as in the first embodiment. The outer size is constant, but the inner size cyclically varies in the extending direction of the magnetic tube 10 (FIG. 18(b)). FIG. 18(c) is a vertical cross-sectional view of a third example of the magnetic tube 10. In this third example, a transverse section of the magnetic tube 10 has a circular ring-like shape as in the first embodiment. The inner size is constant, but the outer size cyclically varies in the extending direction of the magnetic tube 10 (FIG. 18(c)). In each of the magnetic tubes 10 shown in FIGS. 18(a) through 18(c), each cycle of the shape corresponds to the length of 1 bit (the record length). In each of the magnetic tubes 10 shown in FIGS. 18(a) and 18(c), domain walls tend to be formed at the portions with smaller outer diameters. In the magnetic tube 10 shown in FIG. 18(b), domain walls tend to be formed at the portions with the largest inner diameter. Accordingly, the record length can be accurately set by forming the magnetic tube 10 as in any of FIGS. 18(a) through 18(c).

As described above, the first embodiment can provide a magnetic memory that can lower manufacturing costs.

Second Embodiment

Referring now to FIGS. 19(a) through 20(b), a magnetic memory of a second embodiment is described. The magnetic memory of the second embodiment has more than one reference portion 18 provided on the single magnetic tube 10 described in the first embodiment. By providing more than one reference portion on a single magnetic tube as in the magnetic memory of the second embodiment, the magnetic tube can be efficiently used in terms of recording capacity.

FIGS. 19(a) and 19(b) show the magnetic memory 1 of the first embodiment having the single reference portion 18. In the magnetic memory 1 in this example, the magnetic tube 10 has such a length that 37-bit magnetic domains can be formed therein. If the portion of the magnetic tube 10 adjacent to the reference portion 18 is used only for writing and reading, 36-bit information can be stored in this magnetic tube 10. As already mentioned, the magnetic memory 1 involves a shift operation in a read operation. Therefore, the magnetic tube 10 is required to have a portion that serves as a buffer to save shifted bits. The required length of the buffer is equivalent to the amount of read information to be stored. In view of this, in a case where a single reference portion 18 is provided, the optimum position of the reference portion 18 is the midpoint of the magnetic tube 10, as shown in FIG. 19(b). However, even in the optimum case, the rate of utilization of the magnetic tube 10 as a recording medium is approximately 50% at most.

In the magnetic memory 1 of the second embodiment, on the other hand, reference portions 18a, 18b, and 18c are provided on a single magnetic tube 10, to increase the recording capacity, as shown in FIGS. 20(a) and 20(b). An intermediate layer is provided between the magnetic tube 10 and each of the reference portions 18a, 18b, and 18c, as in the first embodiment. As shown in FIGS. 20(a) and 20(b), the three reference portions 18a, 18b, and 18c are arranged at regular intervals. The length of the recordable portion of the magnetic tube 10 is equivalent to 36 bits, as in the case illustrated in FIGS. 19(a) and 19(b). The 36 bits are evenly divided into four 9-bit portions by the respective reference portions 18. In this case, shifts equivalent to 9 bits at most should be allowed in write and read operations. Accordingly, 27-bit information can be stored in the upper three domains in the magnetic tube 10 shown in FIGS. 20(a) and 20(b), and the remaining domain below the reference portion 18c can serve as a buffer. As a result, even if the same magnetic tube 10 as that shown in FIGS. 19(a) and 19(b) is used, the rate of utilization can be increased up to 75% by including the three reference portions 18a, 18b, and 18c. If the number of reference portions is increased while those reference portions are arranged at equally-spaced intervals, the rate of utilization approaches 100%.

As described above, the magnetic memory of the second embodiment has the same structure as the magnetic memory of the first embodiment, except that more than one reference portion is provided. Accordingly, the manufacturing costs can be lowered.

Third Embodiment

Figure 21:
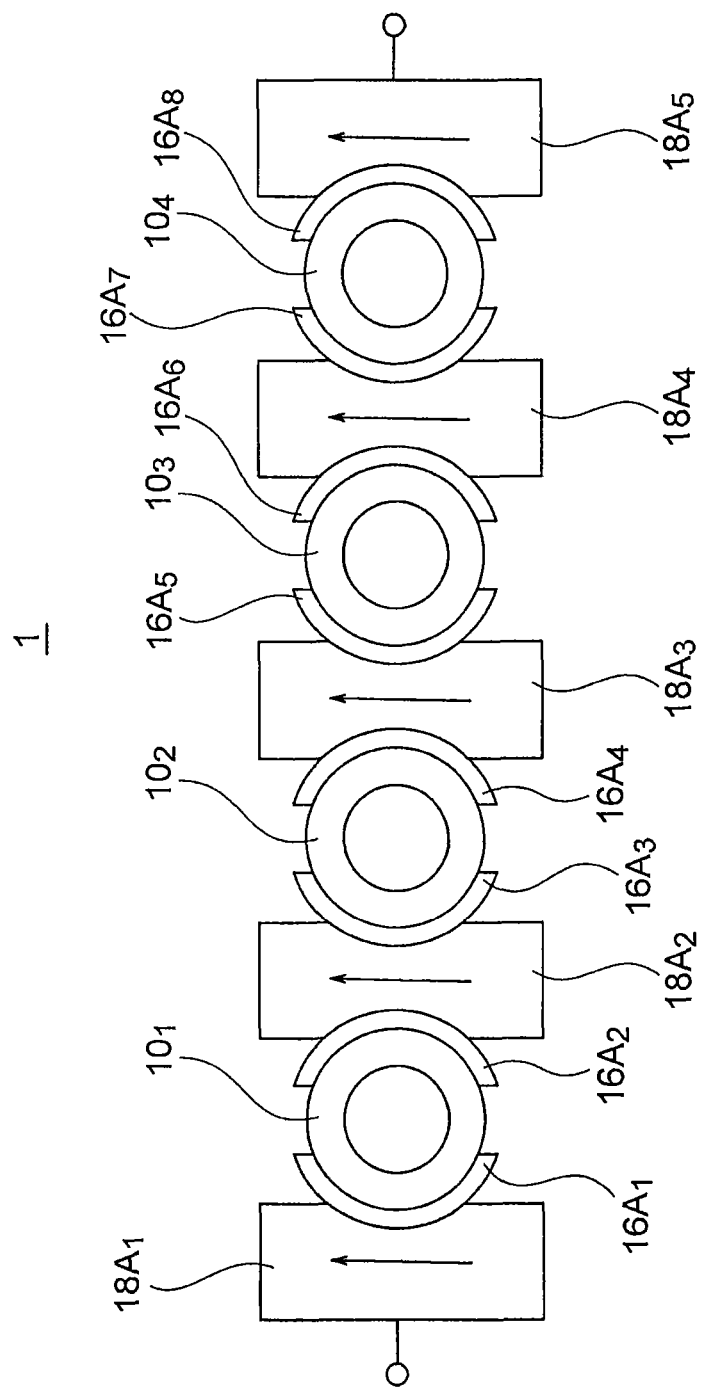
FIG. 21 is a top view of a magnetic memory according to a third embodiment.

Referring now to FIGS. 21 through 29, a magnetic memory according to a third embodiment is described. FIG. 21 is a top view of the magnetic memory of the third embodiment. The magnetic memory 1 of the third embodiment includes magnetic tubes $10_1$ through $10_4$ aligned in a direction being perpendicular to the extending direction thereof, intermediate layers $16A_1$ through $16A_8$, and write reference portions $18A_1$ through $18A_5$. The intermediate layers $16A_{2i-1}$ and $16A_{2i}$ are provided on both sides of each magnetic tube $10_i$ (i=1 through 4). The reference portion $18A_1$ is provided on the opposite side of the intermediate layer $16A_1$ from the magnetic tube $10_1$. The reference portion $18A_2$ is provided between the intermediate layer $16A_2$ and the intermediate layer $16A_3$, and this reference portion $18A_2$ is shared between the magnetic tubes $10_1$ and $10_2$. The reference portion $18A_3$ is provided between the intermediate layer $16A_4$ and the intermediate layer $16A_5$, and this reference portion $18A_3$ is shared between the magnetic tubes $10_2$ and $10_3$. The reference portion $18A_4$ is provided between the intermediate layer $16A_6$ and the intermediate layer $16A_7$, and this reference portion $18A_4$ is shared between the magnetic tubes $10_3$ and $10_4$. The reference portion $18A_5$ is provided on the opposite side of the intermediate layer $16A_8$ from the magnetic tube $10_4$. That is, reference portions are provided on both sides of each magnetic tube via intermediate layers in the direction in which the magnetic tubes are aligned. A reference portion provided between adjacent magnetic tubes is shared between the adjacent magnetic tubes.

In the magnetic memory of the third embodiment having the above described structure, information can be written concurrently into the magnetic tubes $10_1$ through $10_4$. The material of the intermediate layers provided between the reference portions and the magnetic tubes can be a tunnel insulating film material or a nonmagnetic metal material, as described in the first embodiment. However, to prevent large increases in resistance in a case where a large number of magnetic tubes are connected as in the third embodiment, a nonmagnetic metal material is preferred. In that case, parasitic conduction by intermediate layers should be prevented. Therefore, the intermediate layers $16A_{2i-1}$ and $16A_{2i}$ provided on both sides of each magnetic tube $10_i$ (i=1 through 4) are preferably unconnected and are preferably separated from each other as shown in FIG. 21.

Figure 22:
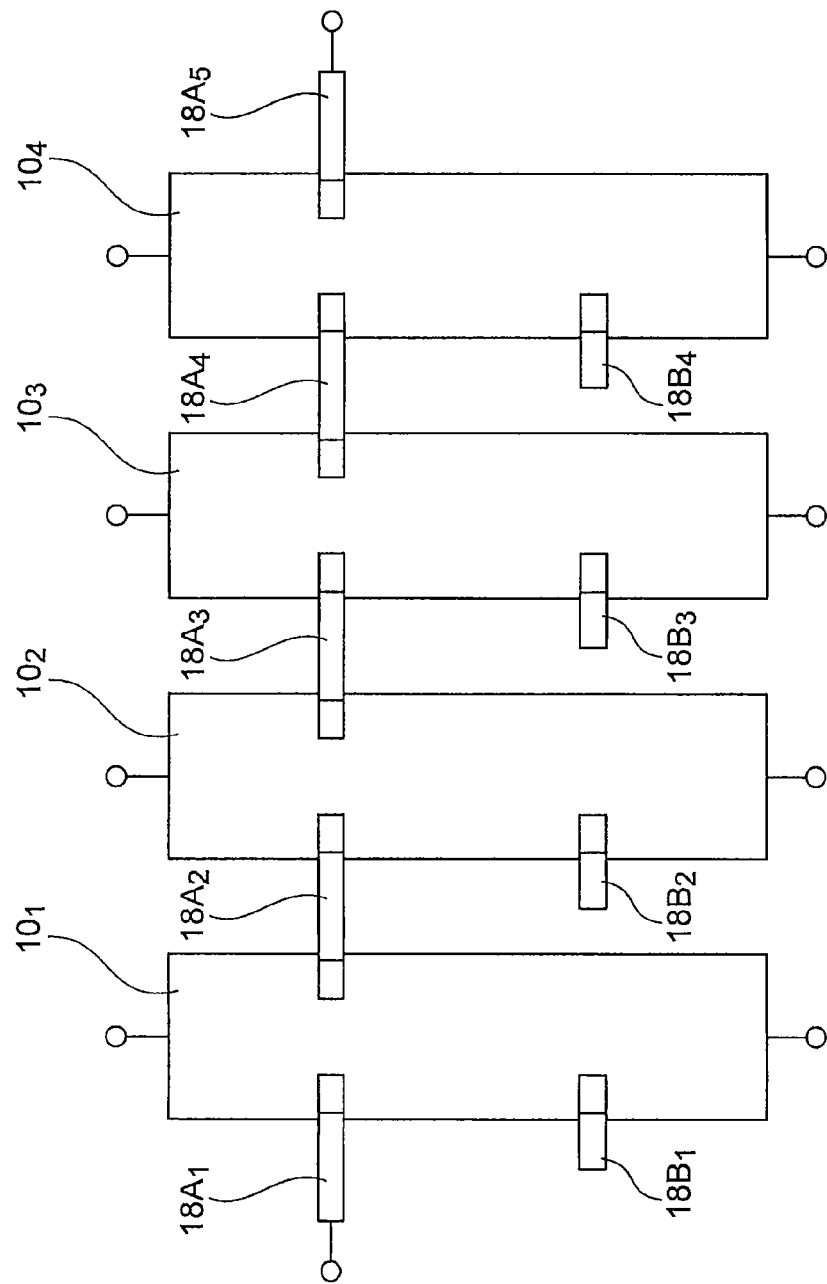
FIG. 22 is a front view of the magnetic memory according to the third embodiment.
Figure 23:
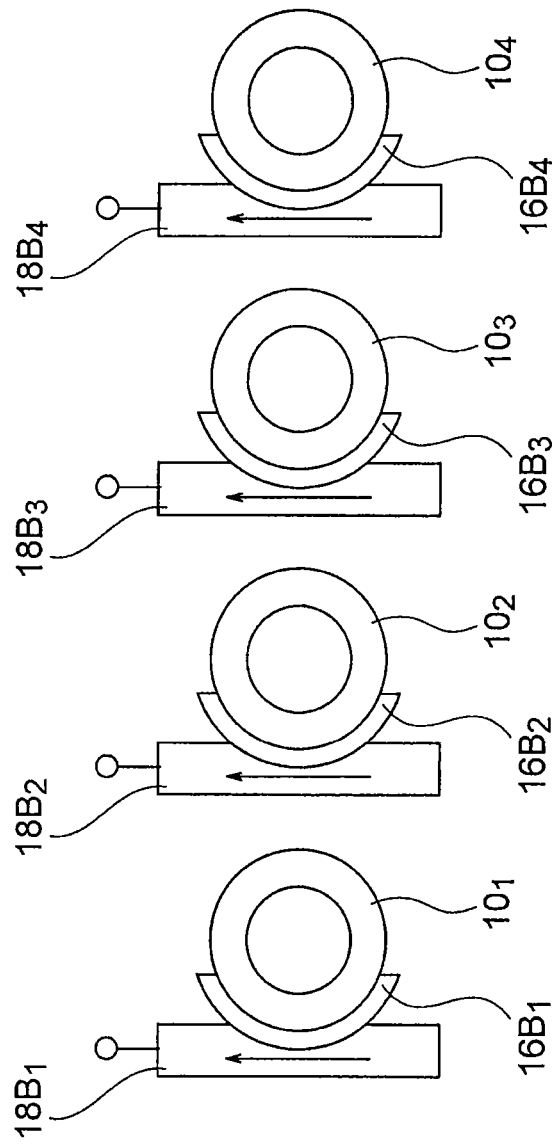
FIG. 23 is a bottom view of the magnetic memory according to the third embodiment.

FIG. 22 is a front view of the magnetic memory of the third embodiment, and FIG. 23 is a bottom view of this magnetic memory. In the third embodiment, the write reference portions $18A_1$ through $18A_5$ connect the magnetic tubes $10_1$ through $10_4$ in series, and therefore, are not suited to the purpose to convert the magnetization states of the respective magnetic tubes into electrical signals by using magnetoresistive effects. In view of this, the magnetic memory 1 of the third embodiment further includes a read reference portion $18B_i$ for each magnetic tube $10_i$ (i=1 through 4).

Figure 24:
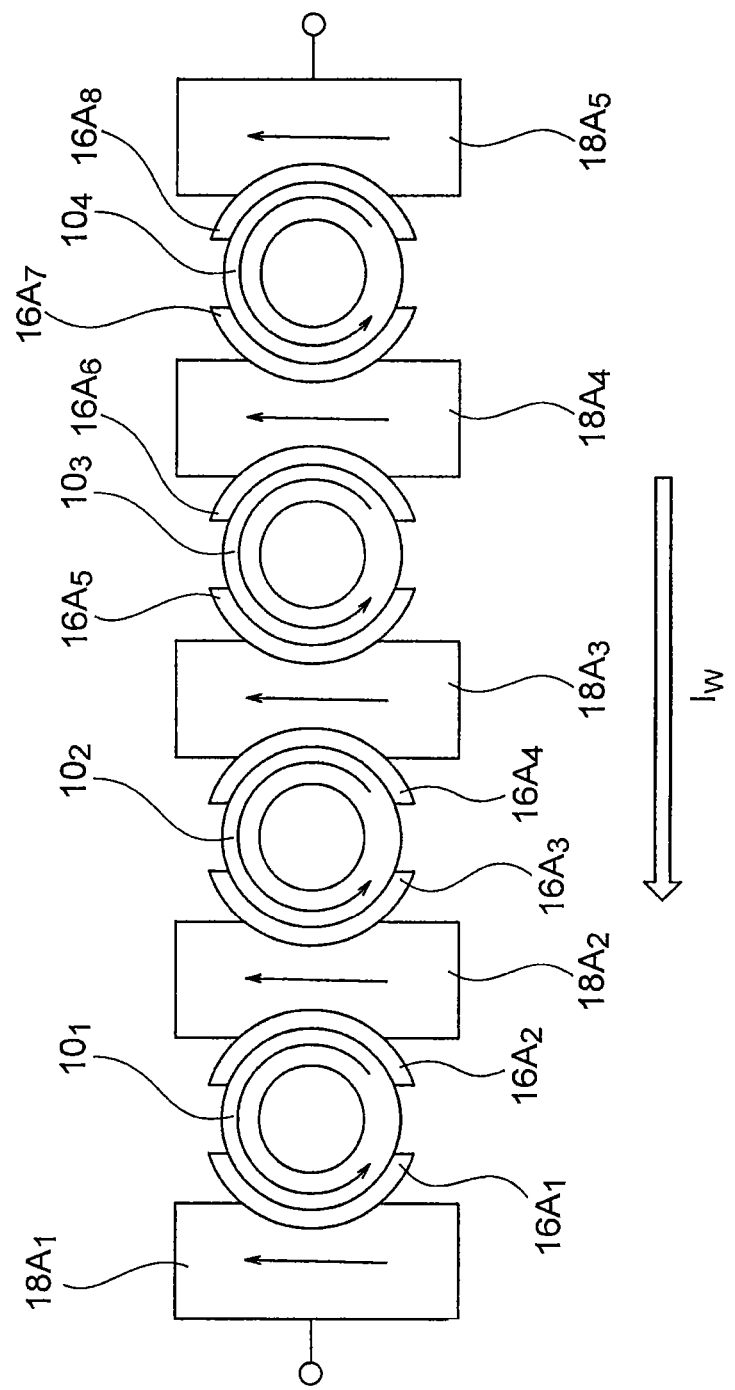
FIG. 24 is a top view for explaining an example write operation of the magnetic memory according to the third embodiment.
Figure 25:
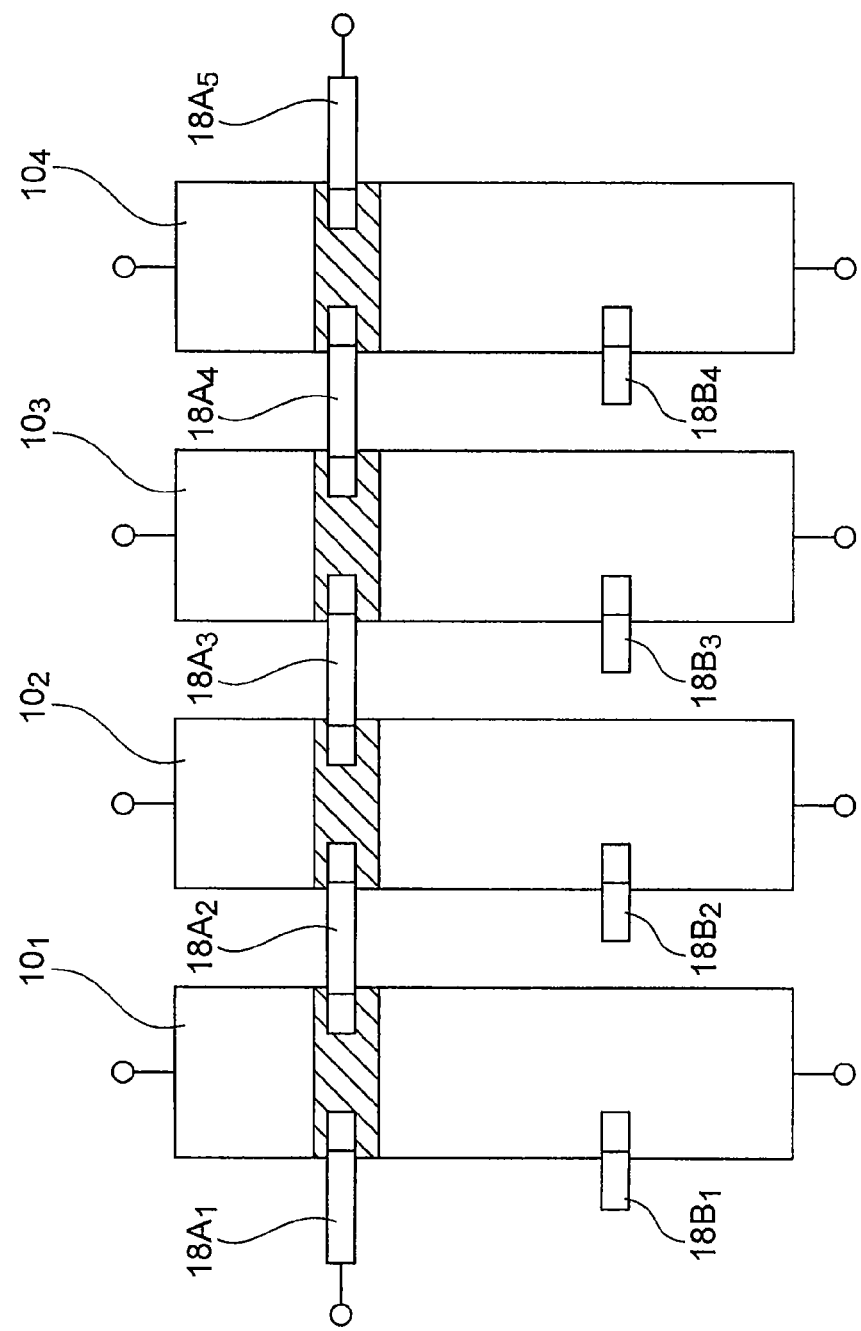
FIG. 25 is a front view for explaining the example write operation of the magnetic memory according to the third embodiment.
Figure 26:
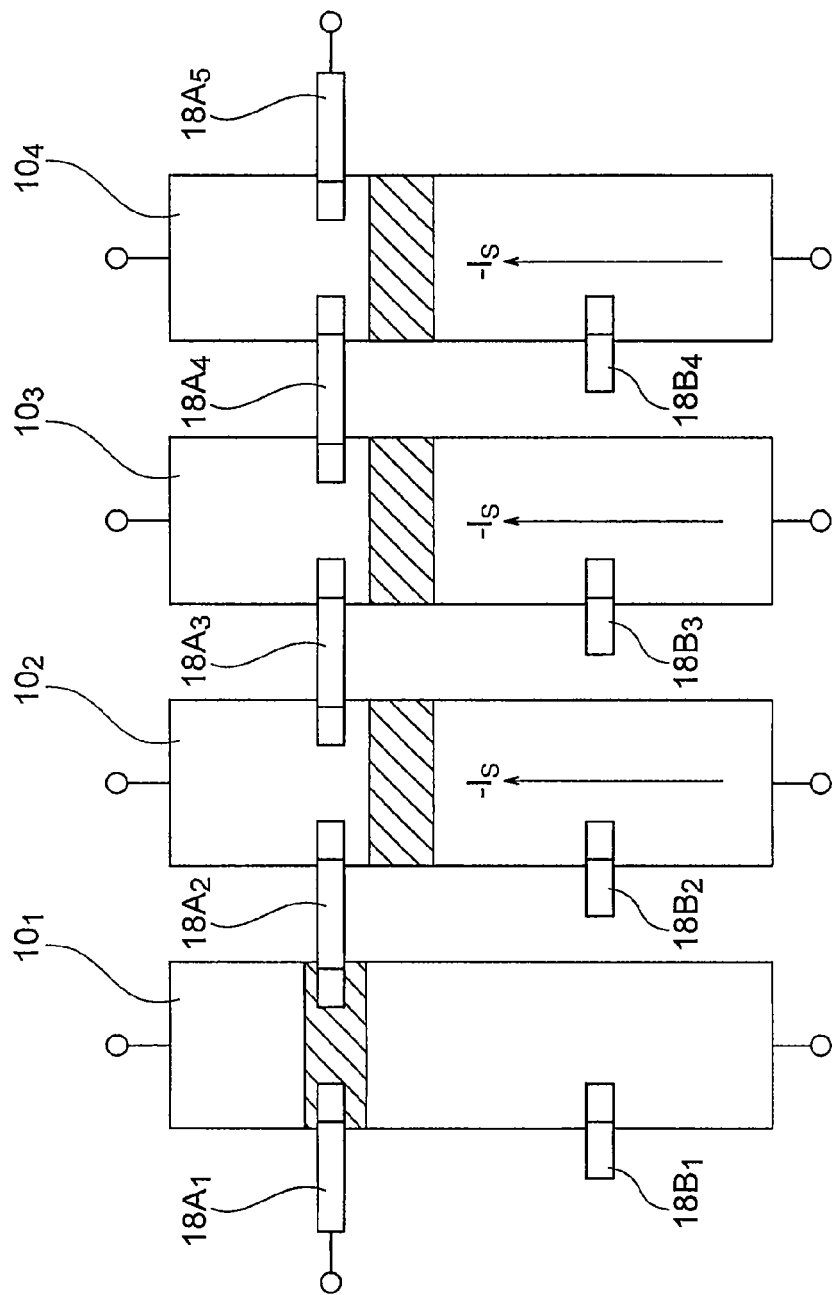
FIG. 26 is a front view for explaining the example write operation of the magnetic memory according to the third embodiment.

In the magnetic memory 1 of the third embodiment, information is written into the magnetic tubes $10_1$ through $10_4$ with a current between the write reference portion $18A_1$ at the left end and the write reference portion $18A_5$ at the right end. As shown in FIG. 24, a write current is flowed to the write reference portion $18A_5$ at the right end from the write reference portion $18A_1$ at the left end, while the magnetizations of all the write reference portions $18A_1$ through $18A_5$ are in upward directions in FIG. 24. As a result, the portion (the shaded portion) of the magnetic tube 10; in the vicinity of each reference portion $18A_i$ (i=1 through 5) is magnetized counterclockwise, as shown in FIG. 25, and the information "1" is written into all the magnetic tubes $10_1$ through $10_4$. At this point, a spin torque causes the magnetization of the right portion of each magnetic tube $10_i$ (i=1 through 4) to be antiparallel to the magnetization of the reference portion $18A_i$, and another spin torque causes the magnetization of the left portion to be parallel to the magnetization of the reference portion $18A_i$. Accordingly, magnetization reversals can be efficiently caused with a lower current value than a current applied in a case where a reference portion is provided only on one side of each magnetic tube.

Figure 32:
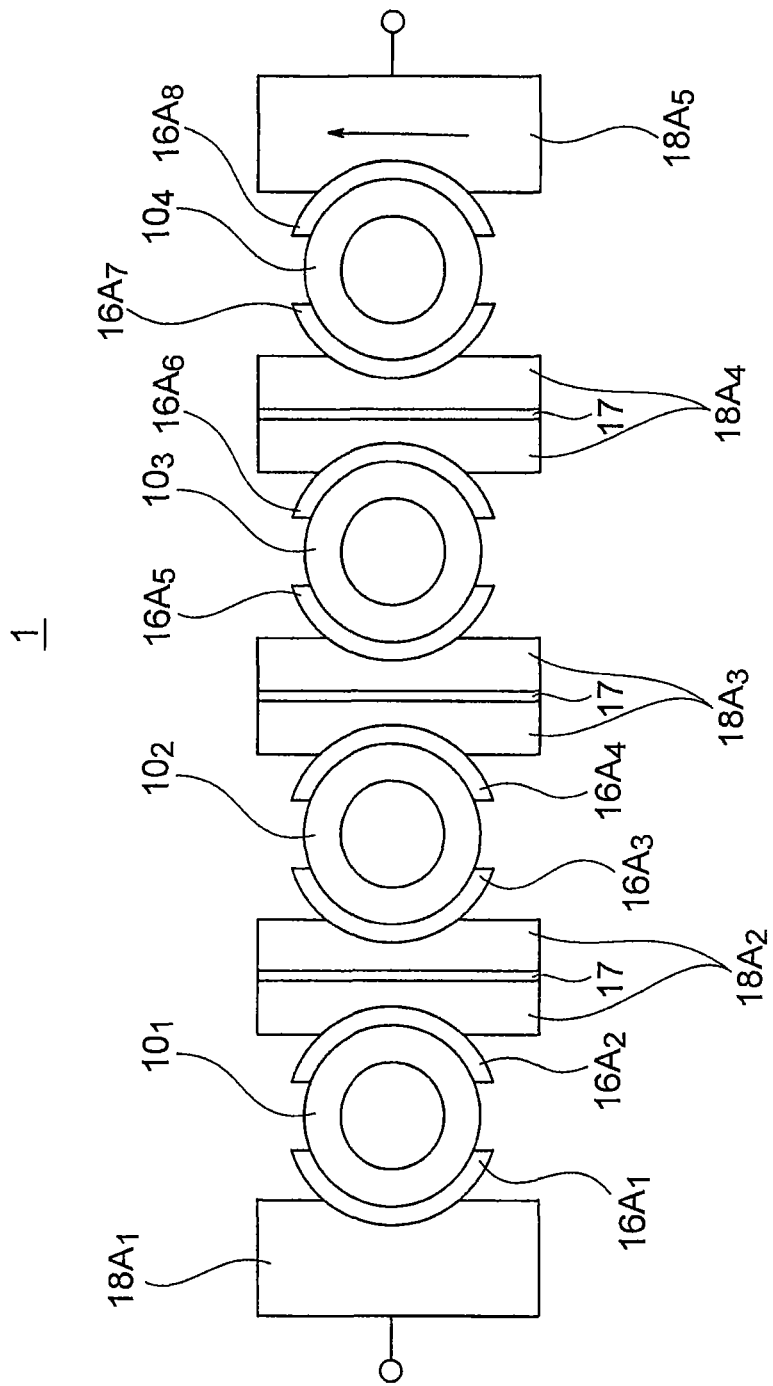
FIG. 32 is a top view of a magnetic memory according to a modification of the third embodiment.

In the third embodiment, the magnetic tubes $10_1$ through $10_4$ are connected in series by the reference portions $18A_1$ through $18A_5$. Accordingly, the information "1" can be recorded with ¼ of the current required for writing information into magnetic tubes one by one. Also, each of the reference portions $18A_2$ through $18A_4$ provided between the adjacent magnetic tubes can be divided into two by a nonmagnetic metal layer 17, as shown in FIG. 32. In this case, the influence of the spin torque generated in each reference portion on the adjacent magnetic tubes can be reduced at the writing operation.

In the third embodiment, the same information is written into all the magnetic tubes concurrently. Therefore, to complete a write operation, a unique shift operation is required. Referring now to FIGS. 26 through 29, an example of a write operation of the magnetic memory 1 according to the third embodiment is described. First, as shown in FIGS. 24 and 25, the information "1" is written into all the magnetic tubes $10_1$ through $10_4$.

After that, to leave the information "1" in the target magnetic tubes, a negative shift current $(-I_S)$ is flowed to the target magnetic tubes $10_2$ through $10_4$, to cause the domain walls to shift by one bit. As a result, the information "1" is written into the magnetic tubes $10_2$ through $10_4$. At this point, the shift current is not flowed to the magnetic tube $10_1$, into which the information "1" does not need to be written.

Figure 27:
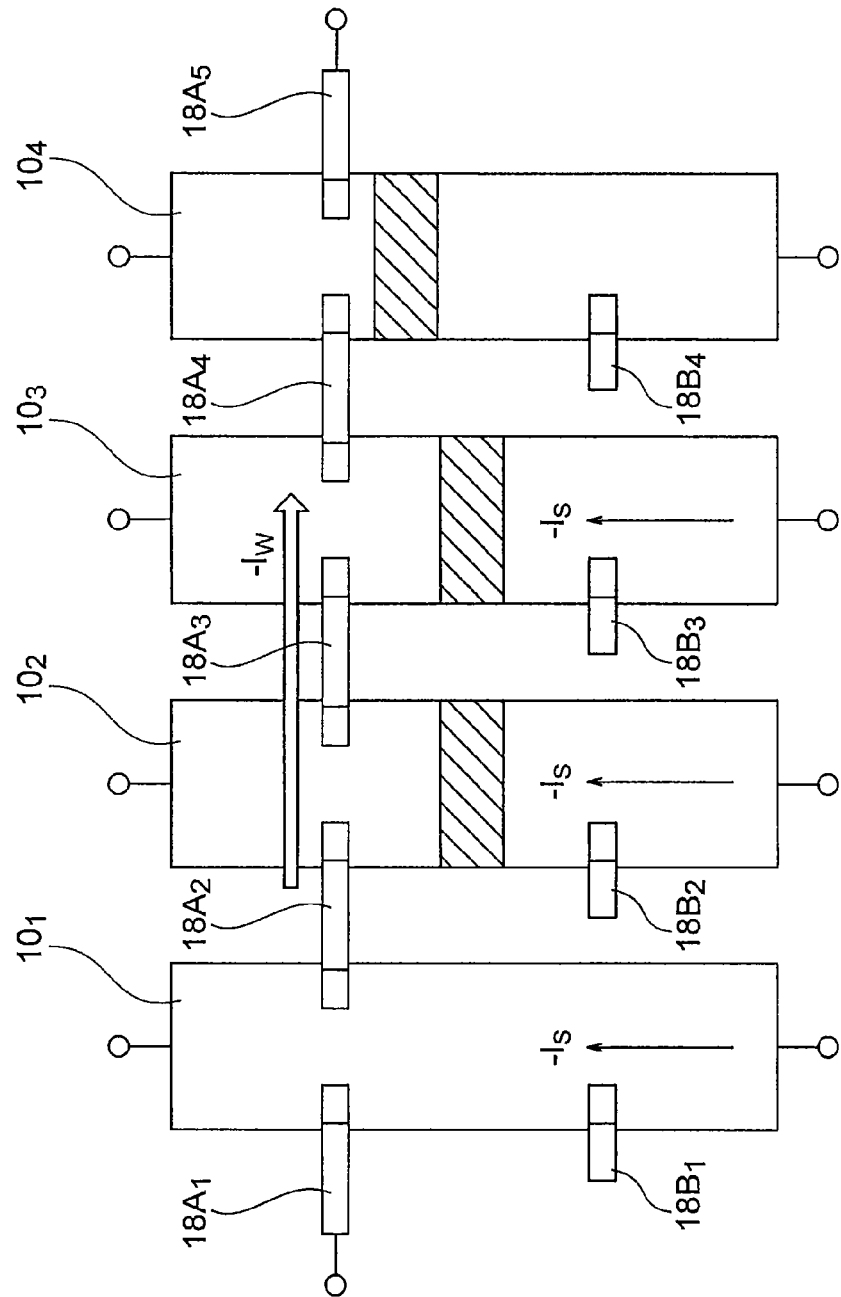
FIG. 27 is a front view for explaining the example write operation of the magnetic memory according to the third embodiment.

A negative write current $(-I_W)$ is then flowed between the write reference portion $18A_1$ at the left end and the write reference portion $18A_5$ at the right end, to write the information "0". The shift current is then flowed only to the magnetic tubes in which the information "0" should be stored (FIG. 27). In the case illustrated in FIG. 27, the shift current is flowed to the magnetic tubes $10_1$ through $10_3$. As a result, the information recorded in the magnetic tubes $10_1$, $10_2$, $10_3$, and $10_4$ at this point are "0", "10", "10", and "1", respectively.

Figure 28:
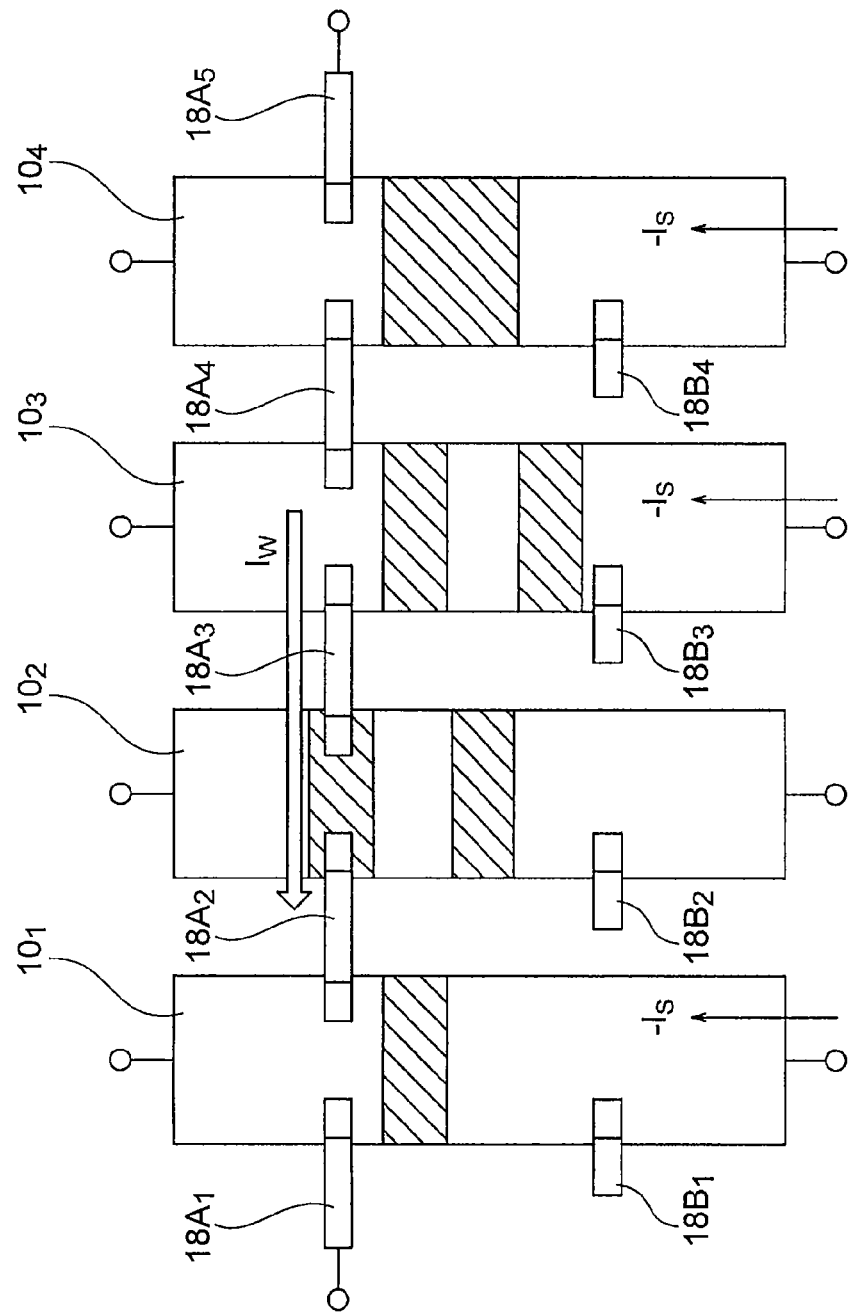
FIG. 28 is a front view for explaining the example write operation of the magnetic memory according to the third embodiment.

FIG. 28 illustrates a situation achieved by again flowing the write current $I_W$, and further flowing the shift current to the magnetic tubes $10_1$, $10_3$, and $10_4$. Through this operation, "01", "10", "101", and "11" are stored in the magnetic tubes $10_1$, $10_2$, $10_3$, and $10_4$, respectively.

Figure 29:
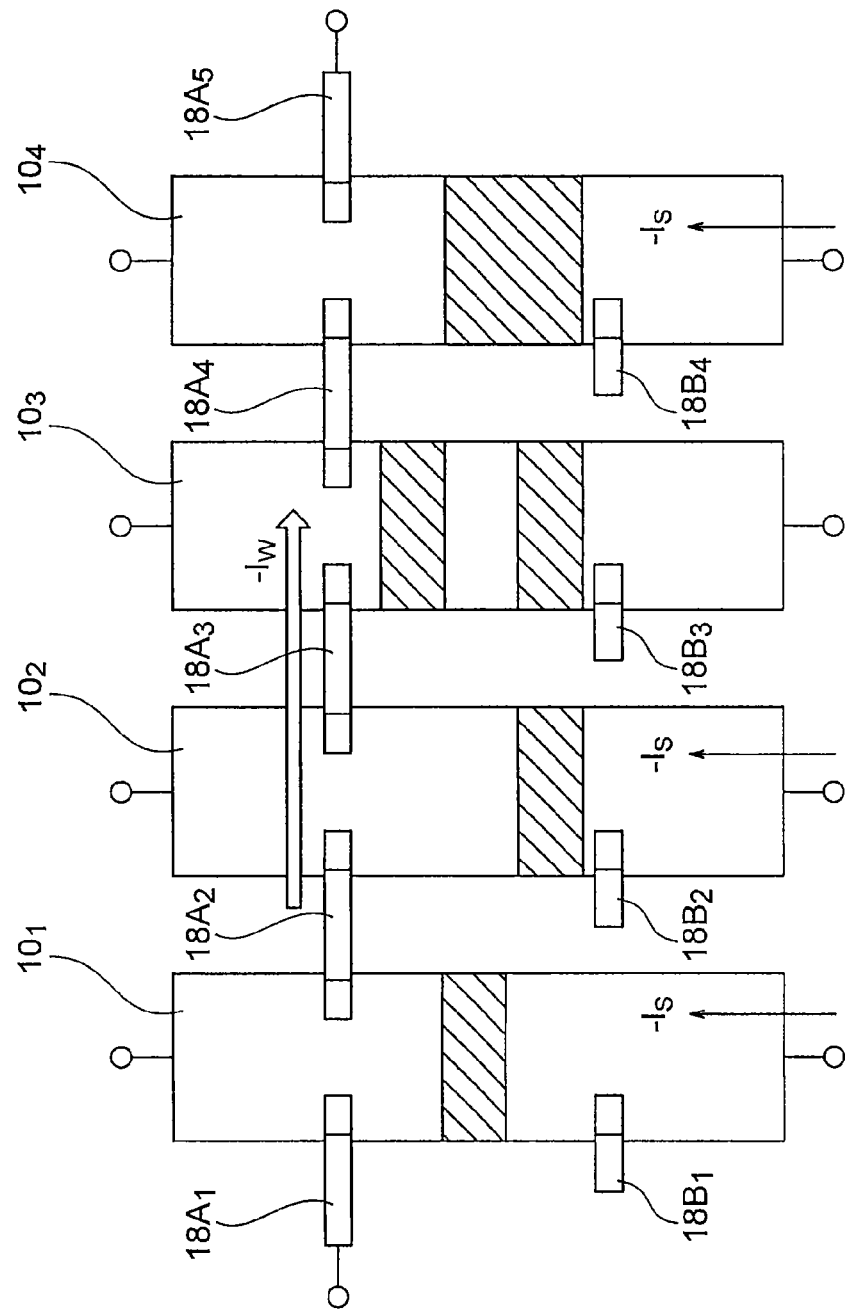
FIG. 29 is a front view for explaining the example write operation of the magnetic memory according to the third embodiment.

Further, as shown in FIG. 29, the write current $-I_W$ is flowed, and the bits in the magnetic tubes $10_1$, $10_2$, and $10_4$ are made to shift by the shift current. As a result, "010", "100", "101", and "110", each of which is 3-bit information, have been input to the magnetic tubes $10_1$, $10_2$, $10_3$, and $10_4$, respectively. As described above, where collective write operations are enabled by connecting in series the magnetic tubes $10_1$ through $10_4$ with the write reference portions $18A_1$ through $18A_5$, not only the write current can be efficiently used, but also inadvertent shift operations due to write operations can be prevented.

Figure 30:
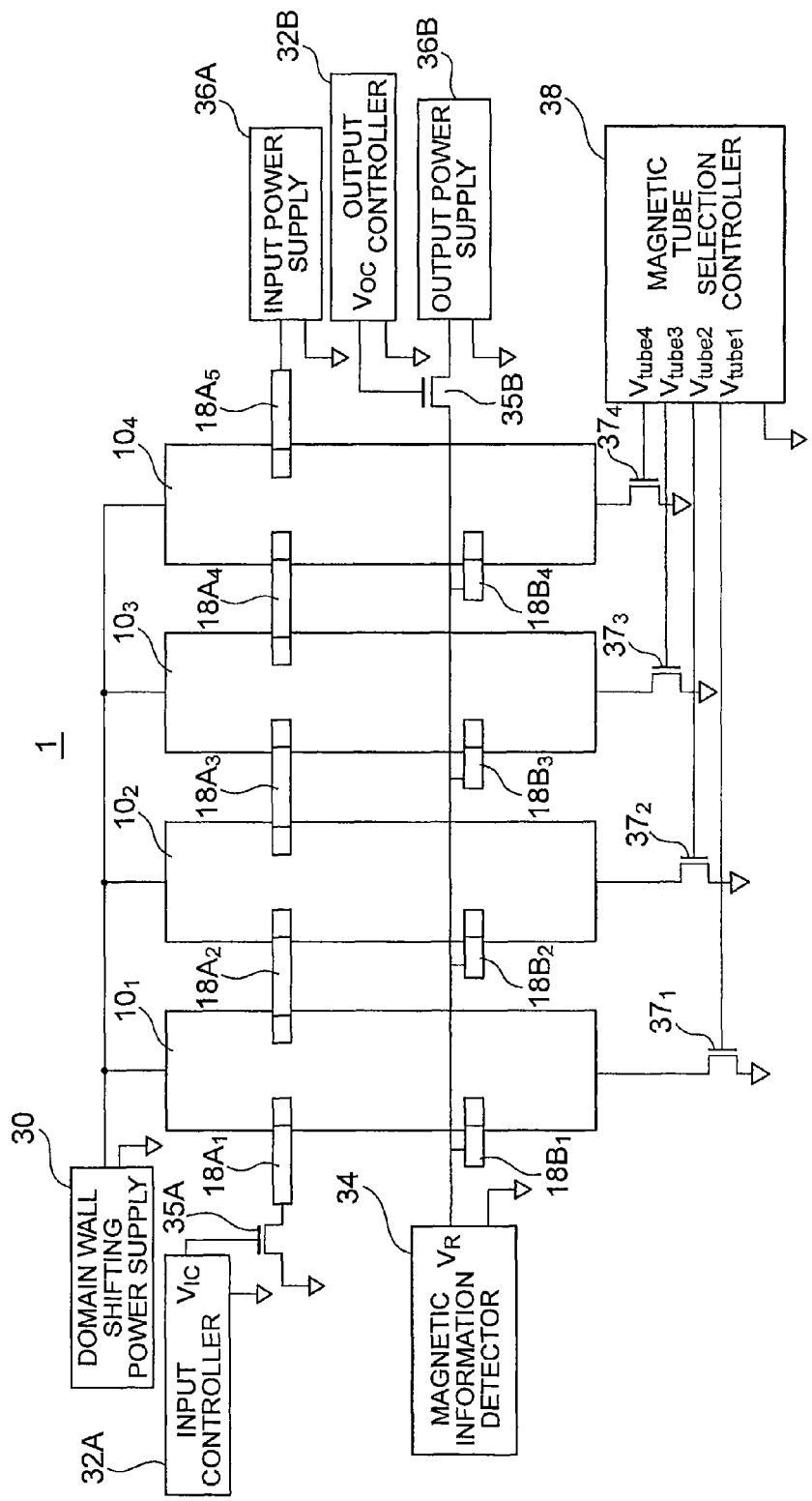
FIG. 30 is a diagram showing peripheral circuits connected to the magnetic memory of the third embodiment.
Figure 31:
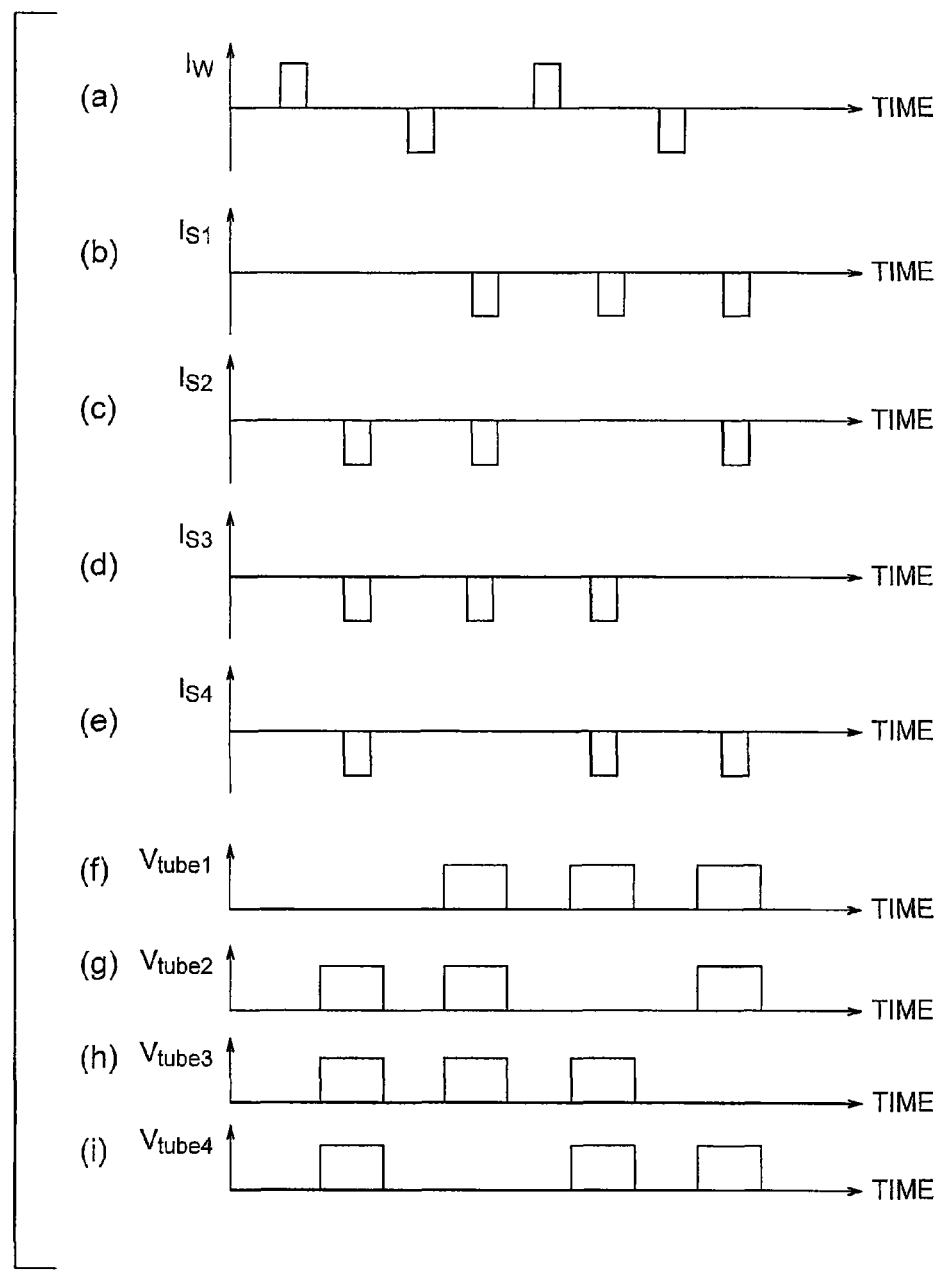
FIGS. 31(a) through 31(i) are timing charts illustrating an example of a collective write operation of the magnetic memory according to the third embodiment.

Collective write operations can be performed on the magnetic tubes in the magnetic memory 1 of the third embodiment by connecting the magnetic memory 1 to the circuits shown in FIG. 30, which are a domain wall shifting power supply 30, an input controller 32A, an output controller 32B, a magnetic information detector 34, an input power supply 36A, an output power supply 36B, and a magnetic tube selection controller 38, for example. The domain wall shifting power supply 30 and the input power supply 36A have bipolar outputs, and can selectively flow a positive current or a negative current where necessary. In FIG. 30, the input power supply 36A is connected to the write reference portion $18A_5$ at the right end of the magnetic memory 1, and a ground line is connected to the write reference portion $18A_1$ at the left end via a transistor 35A. The channel of the transistor 35A is put into a conduction state by a voltage signal $V_{IC}$ from the input controller 32A connected to the gate terminal of the transistor 35A, so that a current can be flowed to the reference portion $18A_5$ from the input power supply 36A.

Each of the read reference portions $18B_1$ through $18B_4$ is connected to the magnetic information detector 34, and is also connected to the output power supply 36B via a transistor 35B. The transistor 35B is put into a conduction state by a voltage signal $V_{OC}$ from the output controller 32B connected to the gate terminal of the transistor 35B, so that a read current $I_R$ is flowed and magnetic information $V_R$ detected by the magnetic information detector 34 is read out.

A transistor $37_i$ is also provided between each magnetic tube $10_i$ (i=1 through 4) and the ground line. No current is flowed to each magnetic tube $10_i$ unless a voltage signal $V_{tubei}$ from the magnetic tube selection controller 38 is applied to the gate terminal of each transistor $37_i$ (i=1 through 4).

In this structure, the above described collective write operation can be realized by supplying the time-series signals shown in FIGS. 31(a) through 31(i), for example, to the magnetic tubes $10_1$ through $10_4$ and the transistors 35A and $37_1$ through $37_4$. The write current $I_W$ is flowed while the voltage signal $V_{IC}$ from the input controller 32A is applied.

The magnetic tube from which magnetic information should be read, or the magnetic tube $10_1$, for example, is selected by the magnetic tube selection controller 38. This selection is performed by supplying a voltage signal $V_{tube1}$ from the magnetic tube selection controller 38 to the transistor 37$_1$. After that, the voltage signal $V_{OC}$ from the output controller 32B is supplied to the gate terminal of the transistor 35B, and the read current $I_R$ is flowed to the magnetic tube 10$_1$ from the output power supply 36B via the reference portion 18B$_1$. The voltage drop $V_R$ that occurs at this point is sensed by the magnetic information detector 34, and is converted into magnetic information. Here, the flowed read current $I_R$ needs to be lower than the write current $I_W$, and the read current $I_R$ is 1/10 of the write current $I_W$, for example.

As described above, the magnetic memory of the third embodiment has the same structure as the magnetic memory of the first embodiment, except that more than one magnetic tube and more than one reference portion are provided. Accordingly, the manufacturing costs can be lowered.

Fourth Embodiment

The magnetization direction in each magnetic tube and each reference portion can be the z-axis direction. In this case, initialization can be performed by applying an external magnetic field in the z-axis direction. Other operations can be performed through the same procedures as those described in the above described embodiments.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic memory comprising:
    a magnetic structure extending in a first direction and having a circular ring-like shape in cross-section in a plane perpendicular to the first direction;
    a nonmagnetic layer formed on an outer surface of the magnetic structure, the outer surface extending in the first direction; and
    at least one reference portion formed on part of a surface of the nonmagnetic layer, the surface being on the opposite side from the magnetic structure, the at least one reference portion containing a magnetic material.

2. The memory according to claim 1, further comprising:
    a first circuit configured to be capable of a first current flowing bi-directionally in the magnetic structure in the first direction;
    a second circuit configured to be capable of a second current flowing bi-directionally between the magnetic structure and the at least one reference portion via the nonmagnetic layer;
    a third circuit configured to flow a third current between the magnetic structure and the at least one reference portion via the nonmagnetic layer, the third current having a smaller absolute value than the second current; and
    a fourth circuit configured to detect a voltage generated between the magnetic structure and the at least one reference portion via the nonmagnetic layer when the third current is applied.

3. The memory according to claim 2, wherein a write operation is performed by flowing the first current after information is stored into a region of the magnetic structure by flowing the second current, the region being in contact with the at least one reference portion via the nonmagnetic layer.

4. The memory according to claim 2, wherein information stored in a region of the magnetic structure is read based on a voltage detected by the fourth circuit by flowing the third current, the region of the magnetic structure being in contact with the at least one reference portion via the nonmagnetic layer.

5. The memory according to claim 1, wherein an angle in a plane perpendicular to the first direction, at the center of a magnetic structure, subtended by a region in which the at least one reference portion is in contact with an outer surface of the magnetic structure via the nonmagnetic layer is less than 180 degrees when seen from the center of the cross-section of the magnetic structure in the plane perpendicular to the first direction.

6. The memory according to claim 1, wherein the at least one reference portion is a plurality of reference portions arranged in the first direction of the magnetic structure.

7. The memory according to claim 1, wherein a thickness of the magnetic material of the at least one reference portion in the first direction is not smaller than 10 nm and not greater than 50 nm.

8. The memory according to claim 1, wherein a thickness of the magnetic structure in the cross-section is constant, and outer and inner sizes of the magnetic structure cyclically vary in the first direction.

9. The memory according to claim 1, wherein an outer size of the magnetic structure is constant, and an inner size of the magnetic structure cyclically varies in the first direction.

10. The memory according to claim 1, wherein an inner size of the magnetic structure is constant, and an outer size of the magnetic structure cyclically varies in the first direction.

11. A magnetic memory comprising:
    a plurality of magnetic structures each extending in a first direction and having a circular ring-like shape in cross-section in a plane perpendicular to the first direction, the plurality of magnetic structures being aligned in a second direction perpendicular to the first direction;
    a plurality of first reference portions corresponding to the respective magnetic structures and being provided on both sides of each of the magnetic structures in the second direction, each of the first reference portions including a magnetic portion;
    a plurality of first nonmagnetic layers provided between the respective magnetic structures and the corresponding first reference portions;
    a plurality of second nonmagnetic layers corresponding to the respective magnetic structures and being provided on outer surfaces of the respective magnetic structures, the outer surfaces extending in the first direction; and
    a plurality of second reference portions corresponding to the respective magnetic structures, each of the second reference portions including a magnetic material, each of the second reference portions being provided on part of a surface of the corresponding second nonmagnetic layer, the surface being on the opposite side from the corresponding magnetic structure,
    wherein the plurality of magnetic structures are electrically connected to one another via the plurality of first reference portions and the plurality of first nonmagnetic layers.

12. The memory according to claim 11, wherein two of the first reference portions are provided for adjacent ones of the magnetic structures and are positioned on facing sides of the adjacent ones of the magnetic structures, the two of the first reference portions being integrated.

13. The memory according to claim 11, wherein two of the first reference portions are provided for adjacent ones of the magnetic structures and are positioned on facing sides of the adjacent ones of the magnetic structures, the two of the first reference portions being connected via a nonmagnetic metal layer.

14. The memory according to claim 11, further comprising:
- a first circuit configured to be capable of selecting each of the magnetic structures and bi-directionally flowing a first current to each selected magnetic structure in the first direction;
- a second circuit configured to be capable of bi-directionally flowing a second current to the plurality of magnetic structures electrically connected to one another via the plurality of first reference portions and the plurality of first nonmagnetic layers;
- a third circuit configured to select one of the magnetic structures and flow a third current to the selected magnetic structure, the third current having a smaller absolute value than the second current; and
- a fourth circuit configured to detect a voltage generated between the selected magnetic structure and the corresponding second reference portion via the corresponding second nonmagnetic layer when the third current is flowed.

15. The memory according to claim 14, wherein a write operation is performed by flowing the first current to each selected magnetic structure after information is stored into regions of the plurality of magnetic structures by flowing the second current, the regions being in contact with the second reference portions via the second nonmagnetic layers.

16. The memory according to claim 14, wherein information stored in a region of the selected magnetic structure is read based on the voltage detected by the fourth circuit by flowing the third current, the region of the selected magnetic structure being in contact with the corresponding second reference portion via the corresponding second nonmagnetic layer.

* * * * *